US010701805B2

(12) United States Patent
Ito

(10) Patent No.: US 10,701,805 B2
(45) Date of Patent: Jun. 30, 2020

(54) COMPOSITE SUBSTRATE, METHOD OF MANUFACTURING COMPOSITE SUBSTRATE, AND METHOD OF MANUFACTURING FLEXIBLE BOARD

(71) Applicant: Murata Manufacturing Co., Ltd., Nagaokakyo-shi, Kyoto-fu (JP)

(72) Inventor: Shingo Ito, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/051,524

(22) Filed: Aug. 1, 2018

(65) Prior Publication Data
US 2018/0343740 A1 Nov. 29, 2018

Related U.S. Application Data

(63) Continuation of application No. PCT/JP2017/004150, filed on Feb. 6, 2017.

(30) Foreign Application Priority Data

Feb. 24, 2016 (JP) .................................. 2016-032585
Jul. 22, 2016 (JP) .................................. 2016-143997

(51) Int. Cl.
*H05K 1/11* (2006.01)
*H05K 3/46* (2006.01)
(Continued)

(52) U.S. Cl.
CPC ............... *H05K 1/118* (2013.01); *H05K 1/14* (2013.01); *H05K 1/144* (2013.01); *H05K 3/361* (2013.01);
(Continued)

(58) Field of Classification Search
CPC ............... H05K 1/118; H05K 2201/05; H05K 2201/058; H05K 2201/053; H05K 3/303;
(Continued)

(56) References Cited

U.S. PATENT DOCUMENTS 4,929,185 A * 5/1990 Wong .................... F16B 35/041
361/810
5,197,902 A * 3/1993 Cesar .................... H05K 1/118
439/395
(Continued)

FOREIGN PATENT DOCUMENTS

JP 60-78191 U 5/1985
JP 09-205314 A 8/1997
(Continued)

OTHER PUBLICATIONS

English translation WO 2015/146448, Yosui et al. (Year: 2015).*
(Continued)

*Primary Examiner* — Steven T Sawyer
(74) *Attorney, Agent, or Firm* — Keating & Bennett, LLP

(57) ABSTRACT

A composite substrate includes a flat cable and a mounting board. The flat cable includes a first end portion and a second end portion, and a first bonding portion, a circuit portion, and a second bonding portion in this order in the length direction from the first end portion toward the second end portion. A positioning hole is disposed between the first end portion and the first bonding portion in the length direction. Another positioning hole is disposed between the second end portion and the second bonding portion in the length direction. The mounting board includes a mounting land conductor and a convex portion. The convex portion is fitted in the positioning hole. The mounting land conductor is bonded by surface mounting to an external connection
(Continued)

conductor of the first bonding portion and an external connection conductor of the second bonding portion.

7 Claims, 22 Drawing Sheets

(51) Int. Cl.
    *H05K 3/36*           (2006.01)
    *H05K 1/14*           (2006.01)

(52) U.S. Cl.
    CPC ............... *H05K 3/368* (2013.01); *H05K 3/46* (2013.01); *H05K 3/4638* (2013.01); *H05K 2201/0367* (2013.01); *H05K 2201/041* (2013.01); *H05K 2203/167* (2013.01)

(58) Field of Classification Search
    CPC ......... H05K 2201/09063; H05K 3/361; H05K 2201/09918
    USPC ........................................... 174/254; 361/749
    See application file for complete search history.

(56) References Cited

U.S. PATENT DOCUMENTS

| | | | | |
|---|---|---|---|---|
| 2009/0242240 | A1* | 10/2009 | Yokouchi | ................ H05K 1/02 174/254 |
| 2011/0304995 | A1* | 12/2011 | Nakanishi | ............ H05K 1/0269 361/749 |
| 2015/0091676 | A1* | 4/2015 | Kato | ...................... H01R 12/62 333/246 |
| 2016/0268666 | A1 | 9/2016 | Wakabayashi et al. | |
| 2016/0372811 | A1* | 12/2016 | Yosui | ..................... H05K 1/025 |

FOREIGN PATENT DOCUMENTS

| | | |
|---|---|---|
| JP | 2003-258401 A | 9/2003 |
| JP | 2007-317968 A | 12/2007 |
| JP | 2008-085211 A | 4/2008 |
| JP | 2009-239007 A | 10/2009 |
| JP | 2009-289923 A | 12/2009 |
| WO | 2014/002592 A1 | 1/2014 |
| WO | 2015/182348 A1 | 12/2015 |

OTHER PUBLICATIONS

English Translation JP2007317968A, Denso Corp (Year: 2007).*
Official Communication issued in International Patent Application No. PCT/JP2017/004150, dated Apr. 11, 2017.

* cited by examiner

COMPOSITE SUBSTRATE, METHOD OF MANUFACTURING COMPOSITE SUBSTRATE, AND METHOD OF MANUFACTURING FLEXIBLE BOARD

CROSS REFERENCE TO RELATED APPLICATIONS

This application claims the benefit of priority to Japanese Patent Application No. 2016-032585 filed on Feb. 24, 2016 and Japanese Patent Application No. 2016-143997 filed on Jul. 22, 2016 and is a Continuation Application of PCT Application No. PCT/JP2017/004150 filed on Feb. 6, 2017. The entire contents of each application are hereby incorporated herein by reference.

BACKGROUND OF THE INVENTION

1. Field of the Invention

The present invention relates to a composite substrate including a mounting board and a flexible board, a method of manufacturing the composite substrate, and a method of manufacturing the flexible board.

2. Description of the Related Art

International Publication No. 2014/002592 discloses a mechanism in which a cable (a flexible board) is fixed to a printed wiring board. The cable includes a hole. The hole includes a conductor on a wall surface of the hole. The conductor on the wall surface of the hole is connected to a conductor pattern wired in the cable. As a result, the conductor on the wall surface of the hole functions as an external connection terminal of the cable.

The printed wiring board includes a fixing portion. The fixing portion includes a projection-shaped conductor. The projection-shaped conductor is connected to the conductor pattern of the printed wiring board through the conductor pattern of the fixing portion. The projection-shaped conductor is fitted in the hole of the cable, which electrically connects the conductor pattern of the cable and the conductor pattern of the printed wiring board.

In the configuration disclosed in International Publication No. 2014/002592, the projection-shaped conductor of the fixing portion and the conductor pattern of the cable are located in proximity to each other and may be short-circuited. As a result, an adverse influence on the electrical characteristics of the cable may be caused. In addition, depending on the bonding state of the projection-shaped conductor of the fixing portion and the conductor pattern of the cable, an adverse influence may be caused on the reliability of bonding between the cable and the printed wiring board.

SUMMARY OF THE INVENTION

Preferred embodiments of the present invention provide composite substrates that are each able to more reliably obtain desired electrical characteristics and have high reliability of bonding between a cable (a flexible board) and a printed wiring board (a mounting board), and methods of manufacturing such composite substrates.

A composite substrate according to a preferred embodiment of the present invention includes a flexible board including a flexible insulating base material; and a mounting board bonded to the flexible board. The flexible board includes a first end portion, a second end portion, a first bonding portion, a second bonding portion, a circuit portion, a first positioning member, and a second positioning member. The first end portion is disposed at one end in a length direction of the flexible insulating base material, and the first bonding portion is disposed in a vicinity of the first end portion. The second end portion is disposed at the other end in the length direction of the flexible insulating base material, and the second bonding portion is disposed in a vicinity of the second end portion. The circuit portion is disposed between the first bonding portion and the second bonding portion in the length direction. The first positioning member is disposed between the first end portion and the first bonding portion in the length direction. The second positioning member is disposed between the second end portion and the second bonding portion in the length direction. The mounting board includes a first mounting board side bonding portion, a second mounting board side bonding portion, a first mounting board side positioning member, and a second mounting board side positioning member. The first mounting board side bonding portion is bonded to the first bonding portion by surface mounting. The second mounting board side bonding portion is bonded to the second bonding portion by surface mounting. The first mounting board side positioning member is fixed to the first positioning member. The second mounting board side positioning member is fixed to the second positioning member.

In this configuration, the flexible board is positioned in a desired position of the mounting board by the first and second positioning members of the flexible board and the first and second mounting board side positioning members of the mounting board. Then, in this positioned state, the flexible board and the mounting board are bonded to each other by the first and second bonding portions and the first and second mounting board side bonding portions.

In addition, in a composite substrate according to a preferred embodiment of the present invention, the first positioning member may include a positioning hole provided in the flexible board, and the first mounting board side positioning member may include a convex portion provided on the mounting board.

With this configuration, a structure of the positioning of the flexible board with respect to the mounting board is easily obtained.

In addition, in a composite substrate according to a preferred embodiment of the present invention, the second positioning member may include a positioning hole provided in the flexible board, and the second mounting board side positioning member may include a convex portion provided on the mounting board.

With this configuration, a more accurate positioning of the flexible board with respect to the mounting board is able to be performed.

In addition, in a composite substrate according to a preferred embodiment of the present invention, the flexible board may include an auxiliary conductor located in proximity to the positioning hole and surrounding the positioning hole in a plan view. The positioning hole may have a shape in which a plane cross sectional area gradually decreases from a surface of the flexible board on a side on which the flexible board is mounted to the mounting board toward a middle position in a thickness direction of the flexible insulating base material.

With this configuration, the convex portion of the mounting board is guided easily and reliably into the positioning hole, and is fixed in the positioning hole.

In addition, in a composite substrate according to a preferred embodiment of the present invention, the first positioning member may include a convex portion provided on the flexible board, and the first mounting board side positioning member may include a positioning hole provided in the mounting board.

With this configuration, the positioning structure of the flexible board with respect to the mounting board is easily obtained.

In addition, in a composite substrate according to a preferred embodiment of the present invention, the second positioning member may include a convex portion provided on the flexible board, and the second mounting board side positioning member may include a positioning hole provided in the mounting board.

With this configuration, a more accurate positioning of the flexible board with respect to the mounting board is able to be performed.

In addition, in a composite substrate according to a preferred embodiment of the present invention, the flexible insulating base material may be made of a thermoplastic resin.

In this configuration, in a case in which the flexible insulating base material is a stacked body including a plurality of base material layers that are stacked, the flexible insulating base material is easily obtained by heat and pressure bonding. In addition, in a case in which the flexible insulating base material is made of a thermoplastic resin, although the flexible insulating base material is typically likely to be deformed or displaced by a heating process when the flexible board and the mounting board are bonded, such deformation and displacement are able to be significantly reduced or prevented by using the first positioning member and the second positioning member.

In addition, in a composite substrate according to a preferred embodiment of the present invention, the flexible board may include a curved portion or a corner portion at an intermediate position in the length direction.

In such a configuration, although a change in shape of the flexible board becomes complex when heat is applied to the flexible board, even in such a configuration, the flexible board is reliably positioned on the mounting board, and thus, the boards are bonded to each other.

In addition, in a composite substrate according to a preferred embodiment of the present invention, the circuit portion may preferably include a passive element including a conductor pattern.

In this configuration, the flexible board is used not as a simple transmission line but as a circuit having predetermined characteristics. In addition, the passive element is disposed at a desired position with respect to the mounting board. As a result, the passive element and the circuit of the mounting board are significantly reduced or prevented from adversely affecting each other.

In addition, in a composite substrate according to a preferred embodiment of the present invention, the passive element may include a coil.

In this configuration, the coil is accurately disposed at a desired position of the mounting board. As a result, undesired coupling between the circuit of the mounting board and the coil is significantly reduced or prevented.

In addition, a preferred embodiment of the present invention relates to a method of manufacturing a composite substrate in which a flexible board including a flexible insulating base material is mounted on a mounting board, and include the following features. The flexible board includes a first end portion, a second end portion, a first bonding portion, a second bonding portion, a circuit portion, a first positioning member, and a second positioning member. The first end portion is disposed at one end in a length direction of the flexible insulating base material, and the first bonding portion is disposed in a vicinity of the first end portion. The second end portion is disposed at the other end in the length direction of the flexible insulating base material, and the second bonding portion is disposed in a vicinity of the second end portion. The circuit portion is disposed between the first bonding portion and the second bonding portion in the length direction. The first positioning member is disposed between the first end portion and the first bonding portion in the length direction. The second positioning member is disposed between the second end portion and the second bonding portion in the length direction. The method of manufacturing the composite substrate includes a step of fixing each of a first positioning member and a second positioning member to a corresponding mounting board side positioning member of the mounting board. The method of manufacturing the composite substrate includes a step of bonding each of the first bonding portion and the second bonding portion in a planar manner to a corresponding mounting board side bonding portion of the mounting board.

In the above-described method of manufacturing the composite substrate, a composite substrate with the high reliability of connection and bonding between a flexible board and a printed wiring board (a mounting board) is easily manufactured.

In addition, a preferred embodiment of the present invention relates to a method of manufacturing a flexible board, and includes the following features. The flexible board includes a bonding portion disposed in a vicinity of an end portion in a length direction of a flexible insulating base material, and a hole-shaped positioning member disposed between the end portion and the bonding portion in the length direction. The method of manufacturing the flexible board includes a step of providing an auxiliary conductor including an opening, on a specific base material layer of the flexible insulating base material; and a step of forming a through hole in the specific base material layer and a different base material layer. The method of manufacturing the flexible board includes a step of stacking the specific base material layer and the different base material layer while interposing the auxiliary conductor so as to obtain a stacked body; a step of contacting a rigid body on a surface of the stacked body on a side of the different base material layer; and a step of performing isotropic pressing while the stacked body is in contact with the rigid body so as to obtain the flexible board.

In the above-described method of manufacturing the flexible board, the deformation due to a flow of a plurality of base material layers is controlled by the auxiliary conductor and the rigid body. As a result, a positioning hole of the following shape is obtained by the typical method of manufacturing a flexible board. The plane cross sectional area of the positioning hole gradually decreases from a surface of the flexible board on a side on which the flexible board is mounted to the mounting board toward a middle position in a thickness direction of the flexible insulating base material. The positioning hole has a constant plane cross sectional area between the middle position and a surface opposite to the surface of the flexible board on the side on which the flexible board is mounted to the mounting board.

In addition, a method of manufacturing a flexible board according to a preferred embodiment of the present invention includes the following features. The flexible board includes a bonding portion disposed in a vicinity of an end portion in a length direction of a flexible insulating base material, and a hole-shaped positioning member disposed between the end portion and the bonding portion in the length direction. The method of manufacturing the flexible board includes: a step of providing an auxiliary conductor including an opening, on a specific base material layer of the flexible insulating base material; a step of stacking the specific base material layer and a different base material layer while interposing the auxiliary conductor so as to obtain a stacked body; and a step of contacting a rigid body on a surface of the stacked body on a side of the different base material layer. The method of manufacturing the flexible board includes a step of performing isotropic pressing while the stacked body is in contact with the rigid body so as to obtain the flexible board with a concave portion and a step of providing a through hole that communicates with the concave portion, in the flexible board.

Even in the above-described method of manufacturing the flexible board, the deformation due to a flow of a plurality of base material layers is controlled by the auxiliary conductor and the rigid body. As a result, a positioning hole of the following shape is obtained by the typical method of manufacturing a flexible board. The plane cross sectional area of the positioning hole gradually decreases from a surface of the flexible board on a side on which the flexible board is mounted to the mounting board toward a middle position in a thickness direction of the flexible insulating base material. The positioning hole has a constant plane cross sectional area between the middle position and a surface opposite to the surface of the flexible board on the side on which the flexible board is mounted to the mounting board.

According to various preferred embodiments of the present invention, desired electrical characteristics are able to be obtained more reliably, and high reliability of connection and bonding between a flexible board and a mounting board is able to be ensured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 19A shows a state before stacking layers, FIG. 19B shows a state during isotropic pressing, and FIG. 19C shows a completed state.

FIG. 20A shows a state before stacking layers, FIG. 20B shows a state during isotropic pressing, and FIG. 20C shows a completed state.

DETAILED DESCRIPTION OF THE PREFERRED EMBODIMENTS

Figure 1:
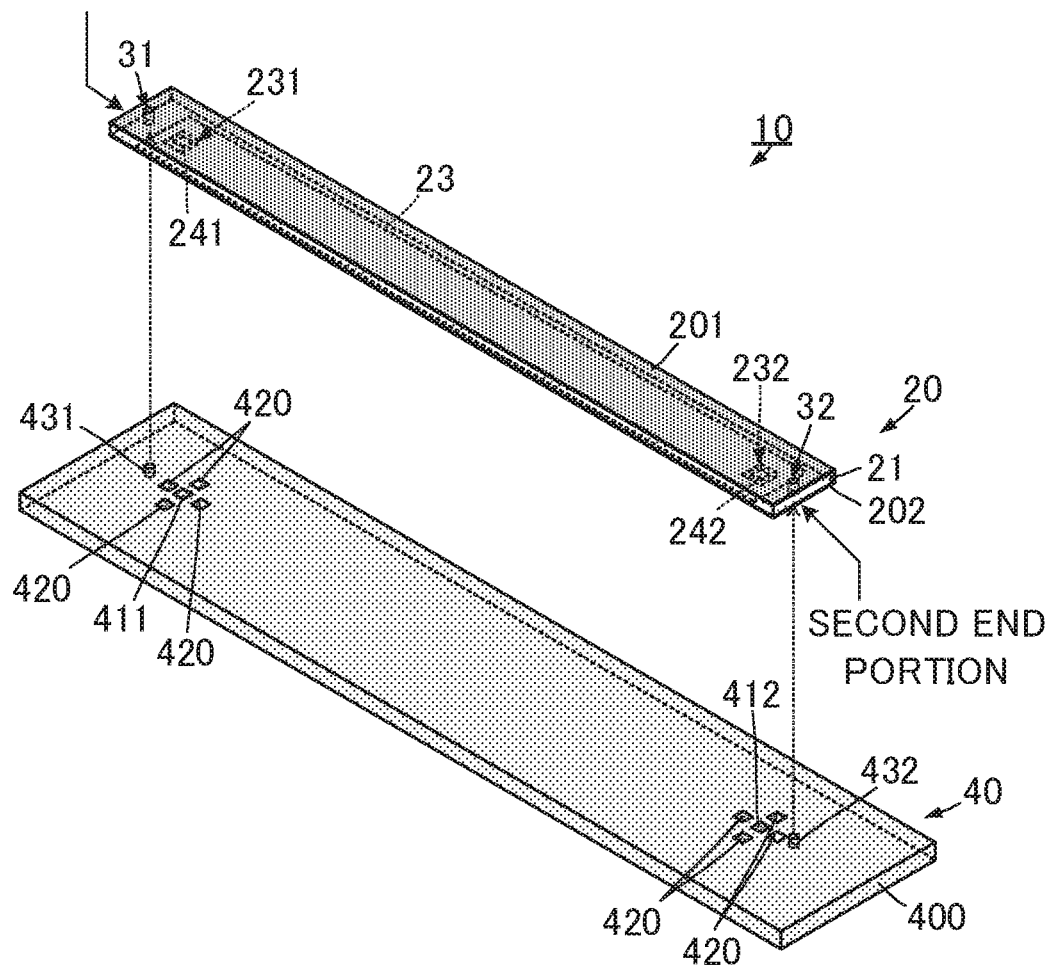
FIG. 1 is an exploded perspective view of a composite substrate according to a first preferred embodiment of the present invention.
Figure 2:
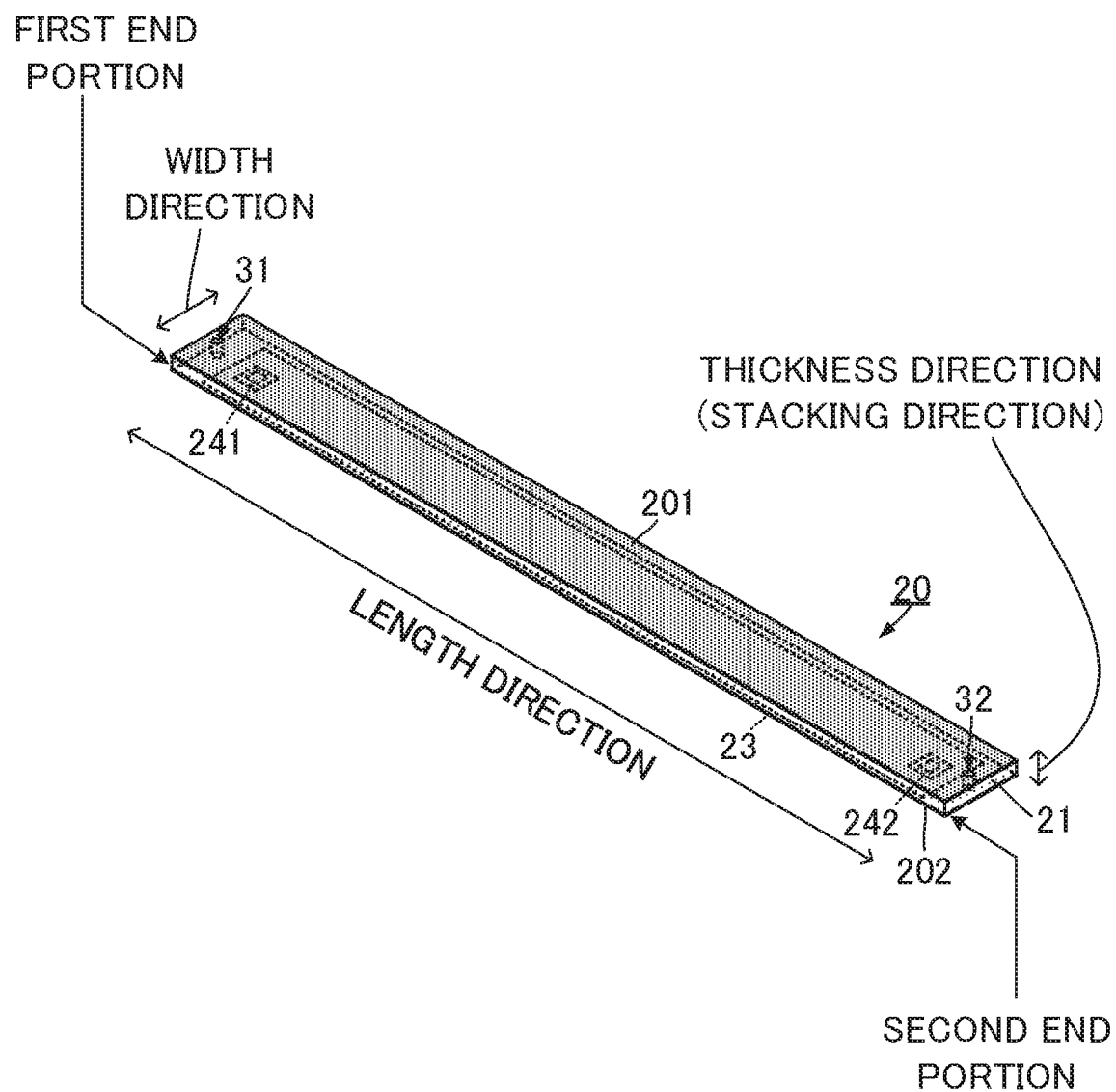
FIG. 2 is an external perspective view of a flat cable as an example of a flexible board according to the first preferred embodiment of the present invention.
Figure 3:
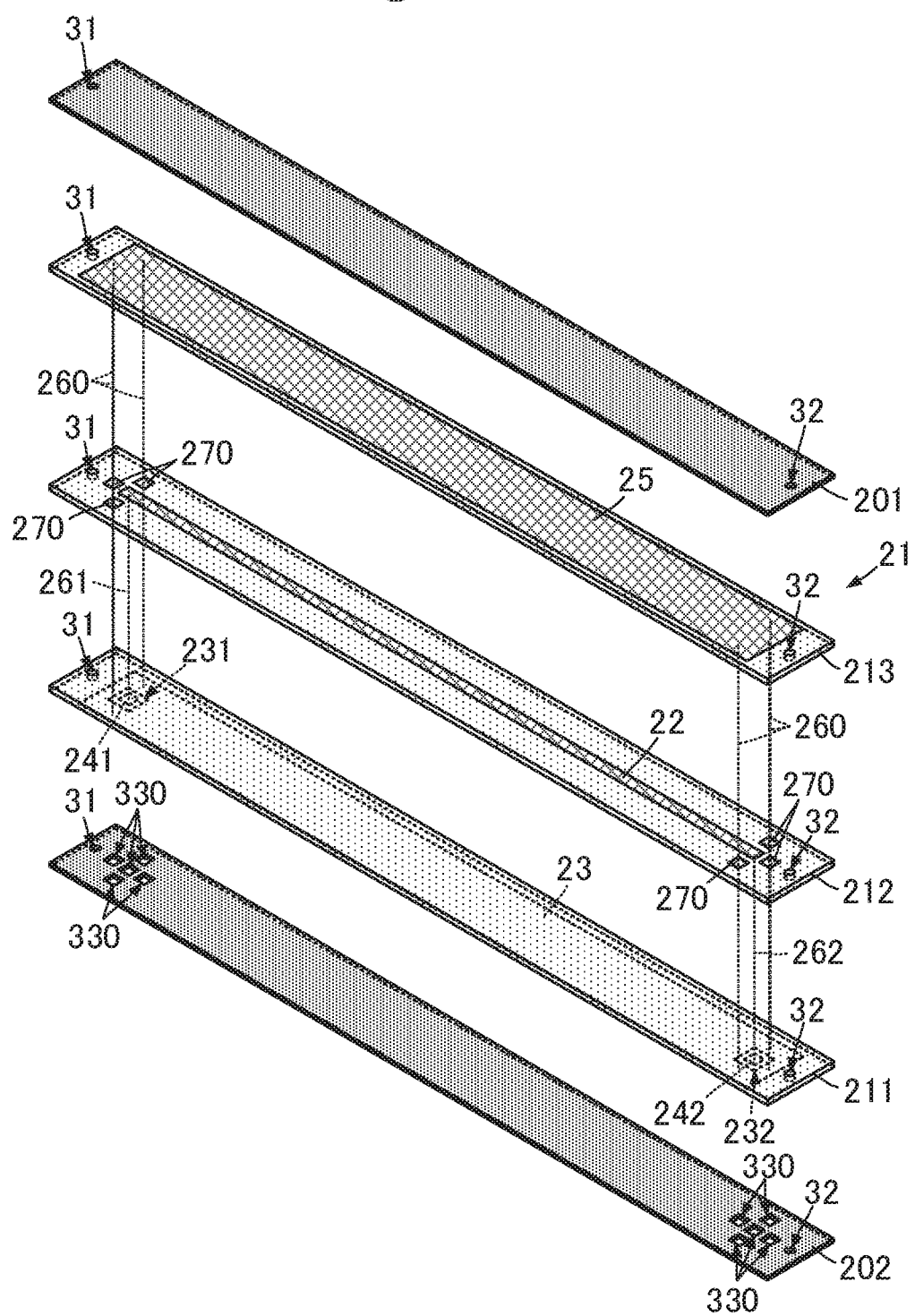
FIG. 3 is an exploded perspective view of the flat cable according to the first preferred embodiment of the present invention.
Figure 4A:
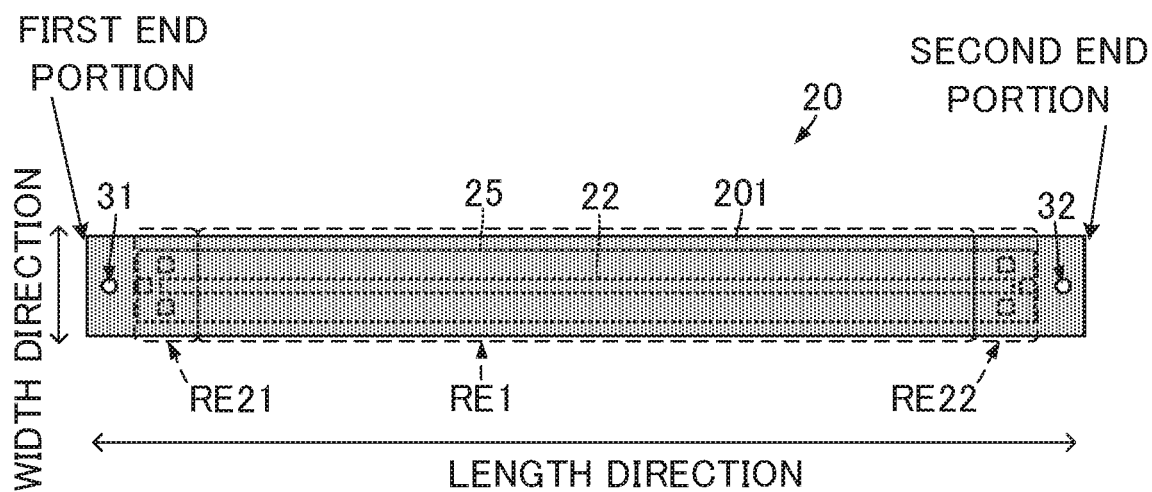
FIG. 4A is a plan view of the flat cable according to the first preferred embodiment of the present invention.
Figure 4B:
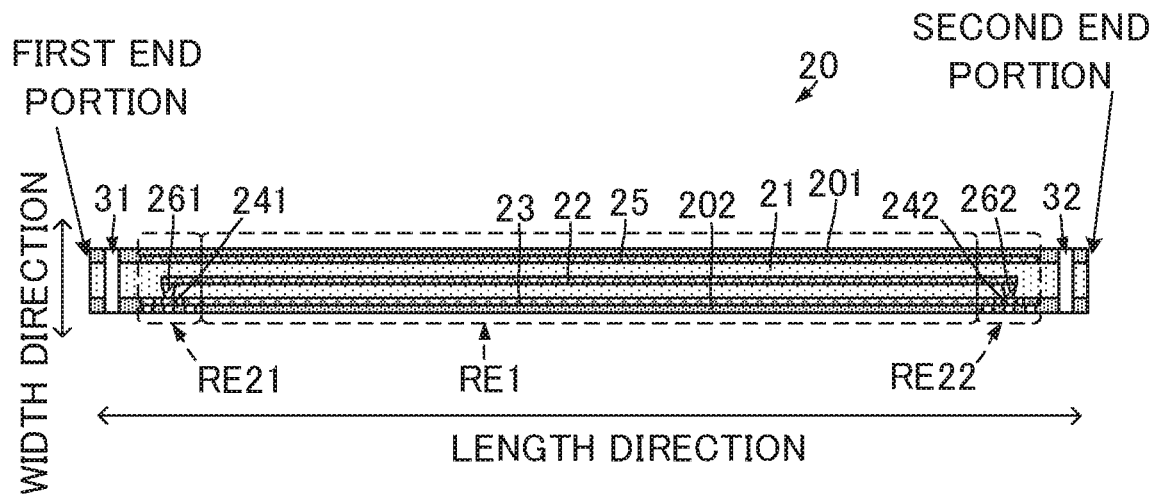
FIG. 4B is a sectional side view of the flat cable according to the first preferred embodiment of the present invention.
Figure 5A:
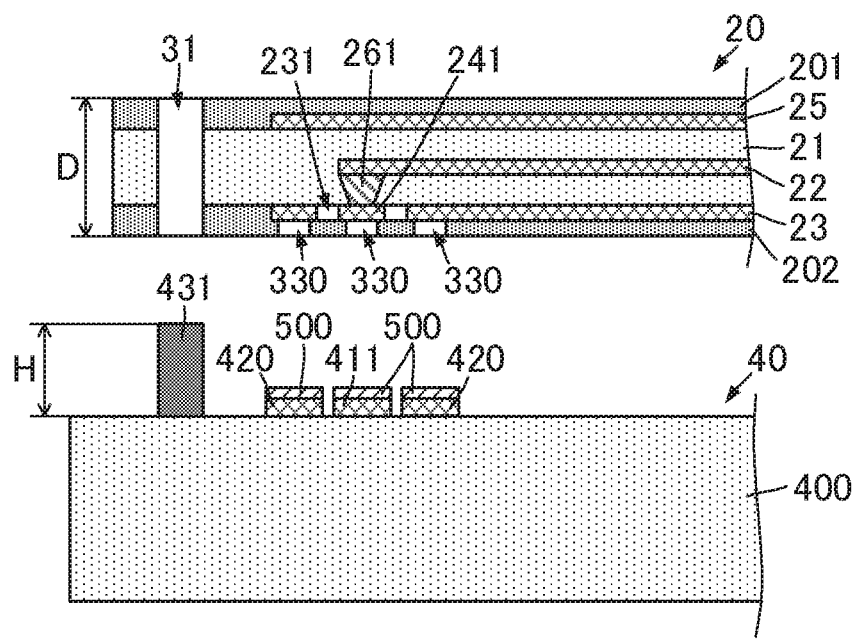
FIG. 5A is an enlarged sectional side view of a bonding portion of the composite substrate according to the first preferred embodiment of the present invention, and shows a state before bonding.
Figure 5B:
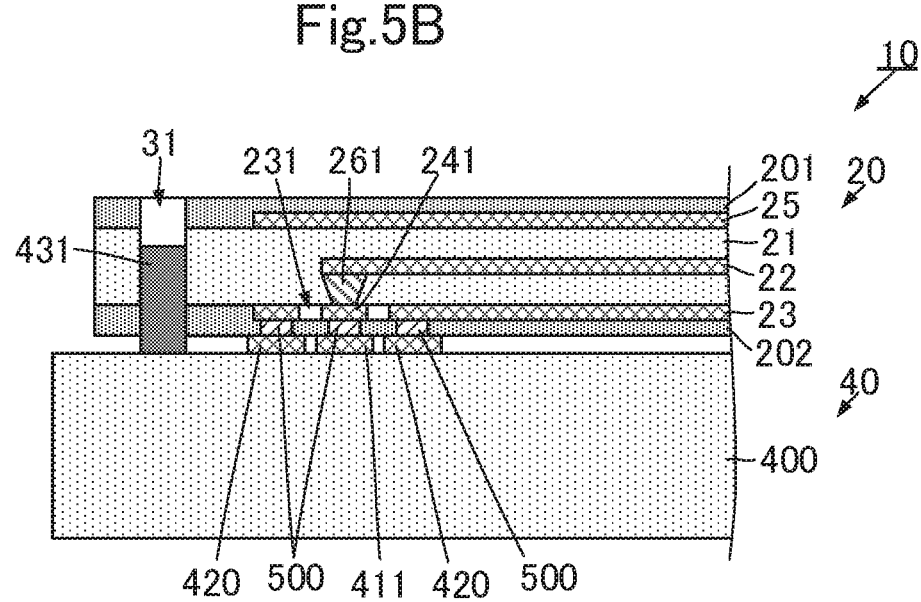
FIG. 5B is an enlarged sectional side view of the bonding portion of the composite substrate according to the first preferred embodiment of the present invention, and shows a bonded state.

Composite substrates and methods of manufacturing composite substrates according to preferred embodiments of the present invention will be described with reference to the drawings. FIG. 1 is an exploded perspective view of a composite substrate according to a first preferred embodiment of the present invention. FIG. 2 is an external perspective view of a flat cable as an example of a flexible board according to the first preferred embodiment of the present invention. FIG. 3 is an exploded perspective view of the flat cable according to the first preferred embodiment of the present invention. FIG. 4A is a plan view of the flat cable according to the first preferred embodiment of the present invention, and FIG. 4B is a sectional side view of the flat cable according to the first preferred embodiment of the present invention. FIG. 4B shows a cross section obtained by cutting the flat cable in the middle position in a width direction in FIG. 4A. FIG. 5A is an enlarged sectional side view of a bonding portion of the composite substrate according to the first preferred embodiment of the present invention, and shows a state before bonding. FIG. 5B is an enlarged sectional side view of the bonding portion of the composite substrate according to the first preferred embodiment of the present invention, and shows a bonded state.

As shown in FIG. 1, the composite substrate 10 includes a flat cable 20 as an example of a flexible board, and a mounting board 40. The flat cable 20 corresponds to "a flexible board". As shown in FIG. 1, FIG. 2, FIG. 3, FIGS. 4A and 4B, the flat cable 20 includes a flexible insulating base material 21 and protective films 201 and 202 having an insulating property. The flexible insulating base material 21 is a flat plate, and extends in a length direction and a width direction. The length in the length direction is larger than the length in the width direction. The protective film 201 is attached on the front surface of the flexible insulating base material 21. The protective film 202 is attached on the rear surface of the flexible insulating base material 21.

As shown in FIG. 3, the flexible insulating base material 21 includes a plurality of base material layers 211, 212, and 213. The plurality of base material layers 211, 212, and 213 are preferably made of a thermoplastic resin, for example. The base material layers 211, 212, and 213 are stacked in this order from the bottom. The base material layers 211, 212, and 213 are bonded with heat and pressure to obtain the flexible insulating base material 21. In a case in which the flexible insulating base material 21 is made of a thermoplastic resin, when the flat cable 20 and the mounting board 40 are bonded by a heating process, the deformation of the flat cable 20 and the displacement between the flat cable 20 and the mounting board 40 are typically likely to occur. However, such deformation and displacement are able to be significantly reduced or prevented using a positioning structure to be described later.

The front surface of the base material layer 211 is in contact with the rear surface of the base material layer 212.

A conductor pattern 23 and external connection conductors 241 and 242 are provided on the rear surface of the base material layer 211. The conductor pattern 23 is provided on the rear surface except in the vicinity of the first end portion and the second end portion in the length direction of the base material layer 211 (the flexible insulating base material 21). In other words, an end portion on the side of the first end portion of the conductor pattern 23 is spaced apart from the first end portion of the flexible insulating base material 21, and an end portion on the side of the second end portion of the conductor pattern 23 is spaced apart from the second end portion of the flexible insulating base material 21.

The external connection conductor 241 is provided at a position spaced apart from the first end portion in the length direction of the base material layer 211. The external connection conductor 241 is surrounded or substantially surrounded by the conductor pattern 23, and is spaced apart from the conductor pattern 23 by a conductor non-formed portion 231. The external connection conductor 242 is provided at a position spaced apart from the second end portion in the length direction of the base material layer 211. The external connection conductor 242 is surrounded or substantially surrounded by the conductor pattern 23, and is spaced apart from the conductor pattern 23 by a conductor non-formed portion 232.

A conductor pattern 22 and a plurality of auxiliary conductors 270 are provided on the surface of the base material layer 212. The conductor pattern 22 is a linear conductor extending in the length direction. The end portion on the side of the first end portion of the conductor pattern 22 overlaps with the external connection conductor 241 in a plan view. The end portion on the side of the second end portion of the conductor pattern 22 overlaps with the external connection conductor 242 in a plan view. The plurality of auxiliary conductors 270 are provided around the end portion on the side of the first end portion and the end portion on the side of the second end portion of the conductor pattern 22. The plurality of auxiliary conductors 270 overlap with the conductor pattern 23 in a plan view.

A conductor pattern 25 is provided on the surface of the base material layer 213. The conductor pattern 25 is provided on the surface except in the vicinity of the first end portion and the second end portion in the length direction of the base material layer 213 (the flexible insulating base material 21). The conductor pattern 25 overlaps with the conductor pattern 23 and the external connection conductors 241 and 242 in a plan view.

The base material layers 211, 212, and 213 include a plurality of interlayer connection conductors 260. The plurality of interlayer connection conductors 260 connect the conductor pattern 25, the plurality of auxiliary conductors 270, and the conductor pattern 23. The base material layers 211 and 212 include interlayer connection conductors 261 and 262. The interlayer connection conductor 261 connects the conductor pattern 22 and the external connection conductor 241. The interlayer connection conductor 262 connects the conductor pattern 22 and the external connection conductor 242.

The external connection conductors 241 and 242 and a portion of the conductor pattern 23 are exposed on the side of the rear surface of the flat cable 20 by a through hole 330 provided in the protective film 202.

As shown in FIG. 1, the mounting board 40 includes a board body 400, mounting land conductors 411, 412, and 420, and convex portions 431 and 432. It is to be noted that, although not shown, other circuit elements are preferably provided or mounted on the mounting board 40. The mounting land conductors 411, 412, and 420 and the convex portions 431 and 432 are provided on a surface of the board body 400.

As shown in FIG. 1 and FIG. 5B, the external connection conductor 241 is bonded in a planar manner to the mounting land conductor 411 by a bonding material 500. The external connection conductor 242 is bonded in a planar manner to the mounting land conductor 412 by the bonding material 500. A portion of the conductor pattern 23 is bonded in a planar manner to each of a plurality of mounting land conductors 420 by the bonding material 500. In this manner, on the side of the first end portion of the flat cable 20, the external connection conductors 241 and a portion of the conductor pattern 23 are bonded to the mounting land conductors 411 and 420 of the mounting board 40 in a planar manner and only through the bonding material 500, so that the high reliability of bonding is able to be ensured. It is to be noted that, although not shown, in the same or similar manner, even on the side of the second end portion of the flat cable 20, the external connection conductors and a portion of the conductor pattern are bonded to the mounting land conductors of the mounting board in a planar manner and only through the bonding material, which is able to improve the reliability of bonding. In other words, the flat cable 20 is surface-mounted on the mounting board 40, so that the reliability of bonding (the bonding reliability of the composite substrate 10) between the flat cable 20 and the mounting board 40 is able to be ensured at a high level. In addition, the composite substrate 10 is able to be reduced in height.

With such a configuration, as shown in FIGS. 4A and 4B, the flat cable 20 includes a first bonding portion RE21 in the vicinity of the first end portion in the length direction. The flat cable 20 includes a second bonding portion RE22 in the vicinity of the second end portion in the length direction. The flat cable 20 includes a circuit portion RE1 between the first bonding portion RE21 and the second bonding portion RE22 in the length direction. In the first preferred embodiment, the circuit portion RE1 is preferably a transmission line defined by a stripline, for example. In addition, the mounting board 40 includes a first mounting board side bonding portion defined by the mounting land conductor 411 and the plurality of mounting land conductors 420 around the mounting land conductor 411. The mounting board 40 includes a second mounting board side bonding portion defined by the mounting land conductor 412 and the plurality of mounting land conductors 420 around the mounting land conductor 412.

Further, as shown in FIG. 1, FIG. 2, FIG. 3, FIGS. 4A and 4B, FIGS. 5A and 5B, the flat cable 20 includes positioning holes 31 and 32. The positioning holes 31 and 32 extend from the rear surface to the front surface of the flat cable 20. In other words, the positioning holes 31 and 32 are holes (through holes) that penetrate the flat cable 20 in the thickness direction.

The positioning hole 31 is disposed between the first end portion of the flat cable 20 and the external connection conductor 241. In other words, the positioning hole 31 is disposed between the first end portion and the first bonding portion RE21 in the length direction of the flat cable 20 (the flexible insulating base material 21). This positioning hole 31 corresponds to "the first positioning member".

The positioning hole 32 is disposed between the second end portion of the flat cable 20 and the external connection conductor 242. In other words, the positioning hole 32 is disposed between the second end portion and the second bonding portion RE22 in the length direction of the flat cable 20 (the flexible insulating base material 21). This positioning hole 32 corresponds to "the second positioning member".

The positioning holes 31 and 32 may be provided in each of the base material layers 211, 212, and 213 before being stacked on one another or may be provided after the base material layers 211, 212, and 213 are stacked on one another. For example, patterning is performed so that no conductor patterns may be provided in a portion in which a positioning hole in the outermost layer is provided, and then the positioning hole is able to be provided by laser irradiation.

As shown in FIG. 1, FIGS. 5A, and 5B, the mounting board 40 includes the convex portions 431 and 432. The diameter of the convex portions 431 and 432 is the same or substantially the same as the diameter of the positioning holes 31 and 32. It is to be noted that the diameter of the convex portions 431 and 432 may preferably be smaller than the diameter of the positioning holes 31 and 32. The convex portion 431 corresponds to "the first mounting board side positioning member". The convex portion 432 corresponds to "the second mounting board side positioning member". The convex portions 431 and 432 may be conductors or may be insulators. However, the convex portions 431 and 432 are more preferably insulators. As a result, the convex portions 431 and 432, while being inserted in the positioning holes 31 and 32, are able to be significantly reduced or prevented from being undesirably coupled to the conductor pattern in the flat cable 20. Therefore, in a state of the composite substrate 10, the flat cable 20 is able to maintain desired electrical characteristics.

The convex portion 431 is fitted in the positioning hole 31 of the flat cable 20 and then fixed in the positioning hole 31. In addition, although not shown in FIG. 5B, the convex portion 432 is fitted in the positioning hole 32 of the flat cable 20 and then fixed in the positioning hole 32. In such a structure, the flat cable 20 is positioned at a desired position (a position to be bonded) of the mounting board 40. In this manner, the flat cable 20 is positioned on the mounting board 40, so that the flat cable 20 and the mounting board 40 are able to be reliably bonded to each other as described above.

Further, in the configuration of the first preferred embodiment, the positioning hole 31 is positioned closer to the side of the first end portion than to the conductor patterns 22, 23, and 25 and the external connection conductor 241, and the positioning hole 32 is positioned closer to the second end portion than to the conductor patterns 22, 23, and 25 and the external connection conductor 242. As a result, the shapes of the conductor patterns 22, 23, and 25 and the external connection conductors 241 and 242 are not subject to the influence of the positioning holes 31 and 32, which enables the flat cable 20 to easily obtain desired electrical characteristics. In addition, since the positioning holes 31 and 32 are spaced apart from the conductor patterns 22, 23, and 25, and the external connection conductors 241 and 242, even when conductive convex portions 431 and 432 are fitted in the positioning holes 31 and 32, a change in the electrical characteristics of the flat cable 20 due to fitting of the convex portions 431 and 432 is able to be significantly reduced or prevented. In other words, even when the mounting board 40 is bonded to the flat cable 20, the flat cable 20 is able to obtain desired electrical characteristics.

It is to be noted that the height H of the convex portions 431 and 432 may preferably be less than or equal to the depth D of the positioning holes 31 and 32. As a result, also when the convex portions 431 and 432 are inserted in the positioning holes 31 and 32, the convex portions 431 and 432 do not project from the side of the surface of the flat cable 20. Thus, the composite substrate 10 is able to be reduced in height.

Further, the height H of the convex portions 431 and 432 may preferably be greater than or equal to one-half of the depth D of the positioning holes 31 and 32, for example. As a result, the convex portions 431 and 432 are unlikely to be detached from the positioning holes 31 and 32. So that the flat cable 20 and the mounting board 40 are able to reliably maintain a positioning state.

Figure 6:
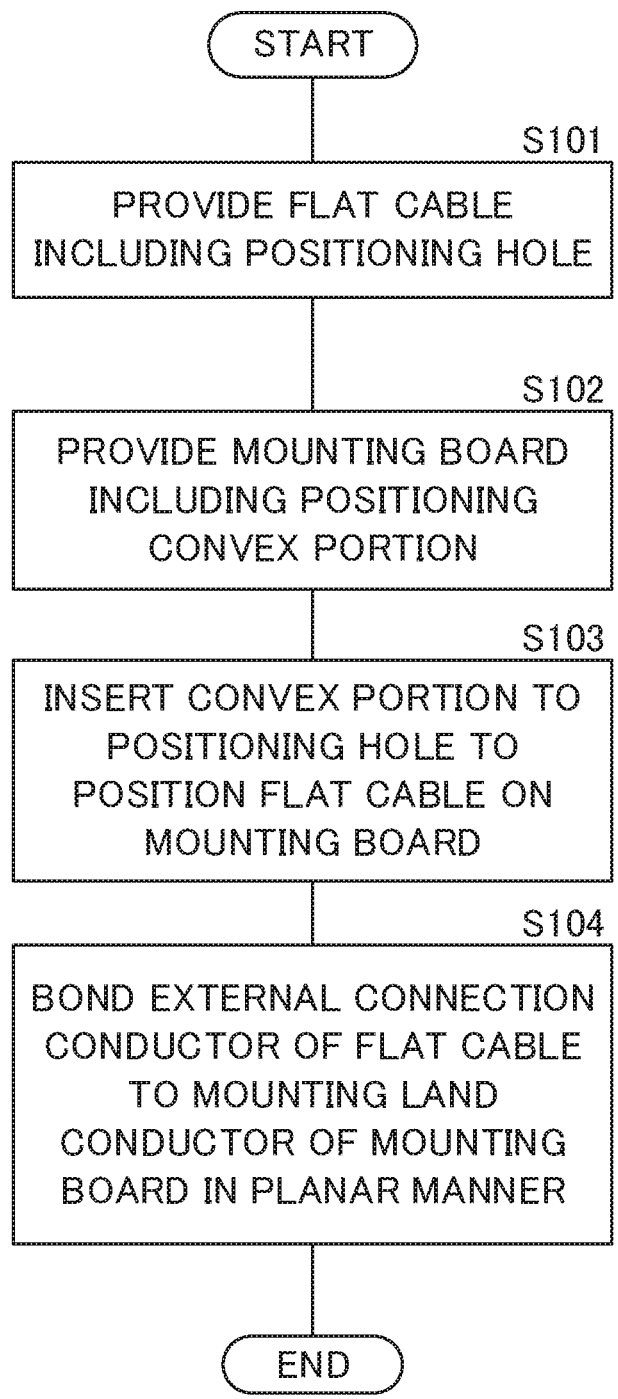
FIG. 6 is a flow chart of a method of manufacturing the composite substrate according to the first preferred embodiment of the present invention.

The composite substrate with such a configuration is able to be manufactured by a non-limiting example of a manufacturing method shown below. FIG. 6 is a flow chart of a method of manufacturing the composite substrate according to the first preferred embodiment of the present invention.

First, a flat cable 20 including positioning holes 31 and 32 is provided (S101). Next, a mounting board 40 including positioning convex portions 431 and 432 is provided (S102). It is to be noted that Steps S101 and S102 may be performed in reverse order or may be simultaneously performed in parallel.

The flat cable 20 is positioned with respect to the mounting board 40 by fitting the convex portion 431 in the positioning hole 31 and fitting the convex portion 432 in the positioning hole 32 (S103). This step corresponds to a step of positioning the flat cable 20 on the mounting board 40. It is to be noted that, at a time of this positioning, the flat cable 20 and the mounting board 40 may be temporarily fixed to each other with an adhesive material, such as an insulating adhesive material, for example. In such a case, the bonding stability at a time of subsequently bonding the flat cable 20 and the mounting board 40 in a planar manner is further improved.

In a state in which the flat cable 20 is positioned on the mounting board 40, the external connection conductors 241 and 242 are bonded to the mounting land conductors 411 and 412 in a planar manner by a process, such as a reflow process (S104), for example. At this time, a portion of the conductor pattern 23 is bonded to the mounting land conductor 420 in a planar manner. This step corresponds to a step of bonding the flat cable 20 on the mounting board 40.

With the use of such a manufacturing method, at the time of bonding, the external connection conductors 241 and 242 reliably face the mounting land conductors 411 and 412. As a result, the flat cable 20 is able to be significantly reduced or prevented from being displaced from a position at which the flat cable 20 is to be bonded to the mounting board 40, and the reliability of bonding the flat cable 20 and the mounting board 40 is able to be improved.

Figure 7A:
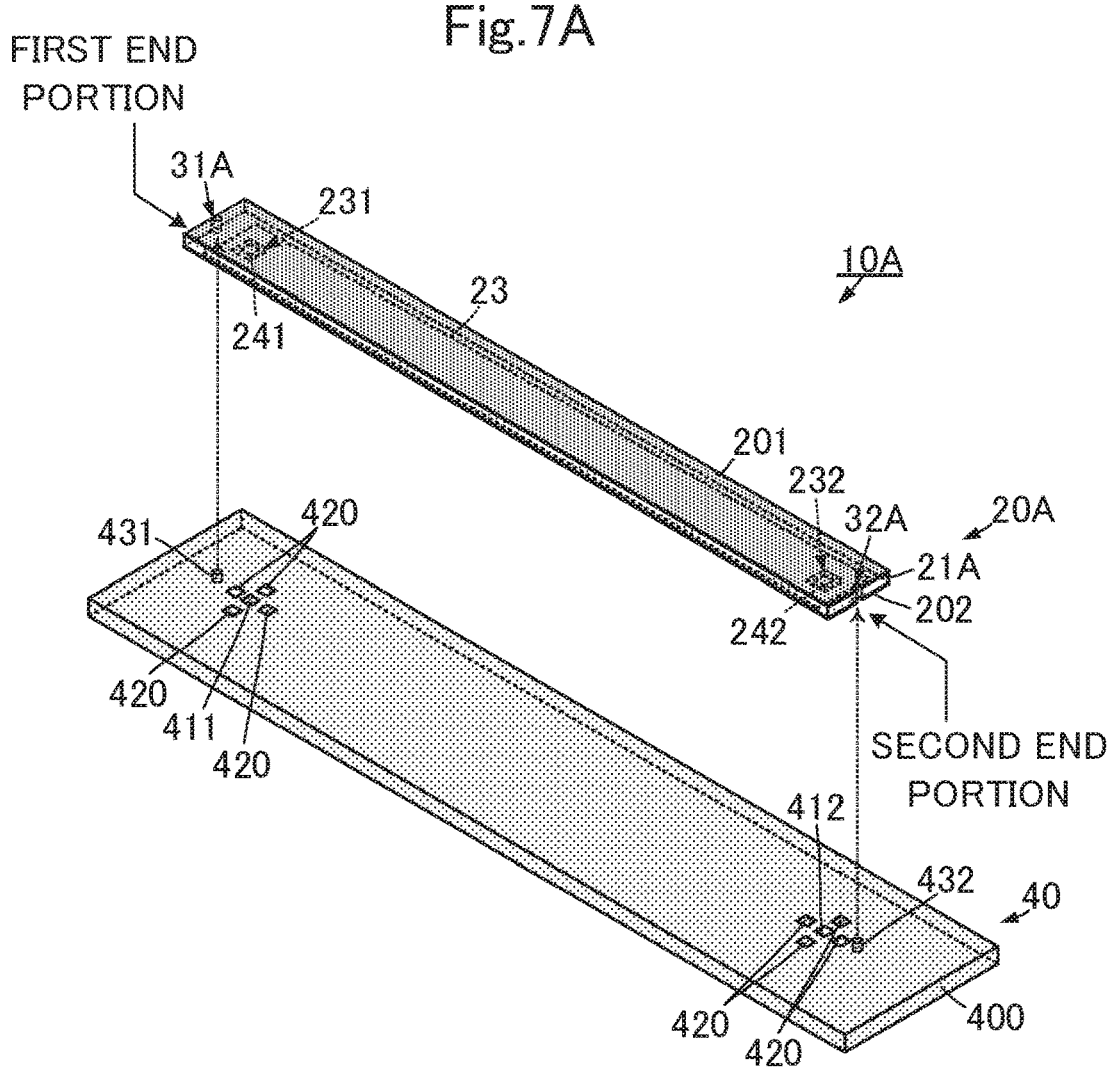
FIG. 7A is an exploded perspective view of a composite substrate according to a second preferred embodiment of the present invention.
Figure 7B:
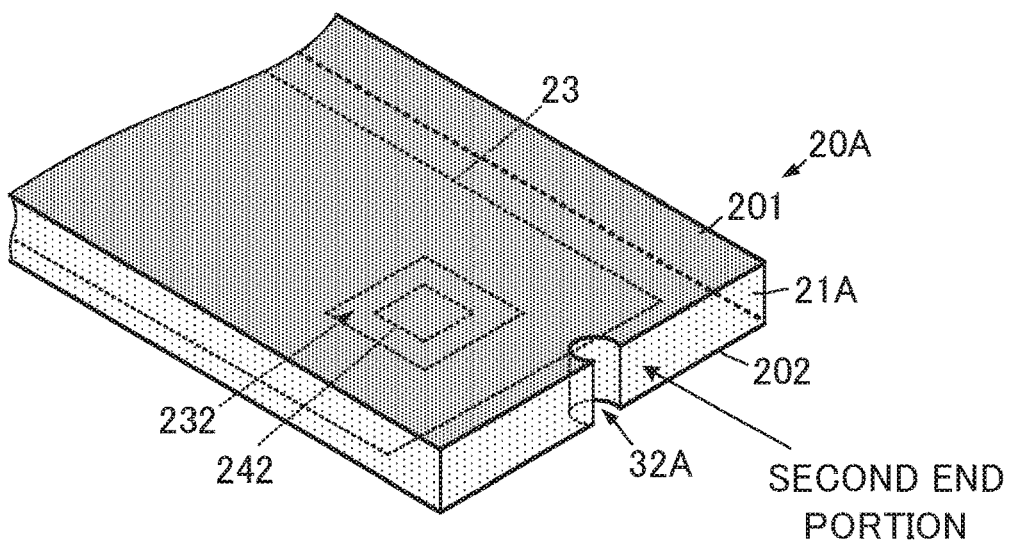
FIG. 7B is an enlarged view of a vicinity of a second end portion of the composite substrate according to the second preferred embodiment of the present invention.

Subsequently, a composite substrate according to a second preferred embodiment of the present invention will be described with reference to the drawings. FIG. 7A is an exploded perspective view of the composite substrate according to the second preferred embodiment of the present invention, and FIG. 7B is an enlarged view of a vicinity of a second end portion of the composite substrate according to the second preferred embodiment of the present invention.

The composite substrate 10A according to the second preferred embodiment is different from the composite substrate 10 according to the first preferred embodiment in the structure of a flat cable 20A. Other configurations are the same or substantially the same as the configurations of the composite substrate 10 according to the first preferred embodiment, and a description of the same or similar configuration will be omitted.

The flat cable 20A is different from the flat cable 20 in the shape of positioning holes 31A and 32A and in the positions in which the positioning holes 31A and 32A are disposed in a flexible insulating base material 21A. The positioning hole 31A is partially open from a first end portion of the flexible insulating base material 21A to the outside. Similarly, the positioning hole 32A is partially open from a second end portion of the flexible insulating base material 21A to the outside.

Even with such a configuration, similarly to the first preferred embodiment, while the flat cable 20A has desired electrical characteristics, the composite substrate 10A with the high reliability of bonding the flat cable 20A and the mounting board 40 is able to be obtained.

It is to be noted that the center or approximate center of the positioning hole 31A preferably does not overlap with the first end portion in a plan view of the flat cable 20A. In other words, the center or approximate center of the positioning hole 31A is preferably located between a first bonding portion RE21 (see FIGS. 4A and 4B) and the first end portion. Similarly, the center or approximate center of the positioning hole 32A preferably does not overlap with the second end portion in a plan view of the flat cable 20A. In other words, the center or approximate center of the positioning hole 32A is preferably located between a second bonding portion RE22 (see FIGS. 4A and 4B) and the second end portion. As a result, the opening width of the end portion of the positioning holes 31A and 32A becomes smaller than the diameter of the positioning holes 31A and 32A, the convex portion 431 is unlikely to detach from the positioning hole 31A, and the convex portion 432 is unlikely to detach from the positioning hole 32A.

Figure 8:
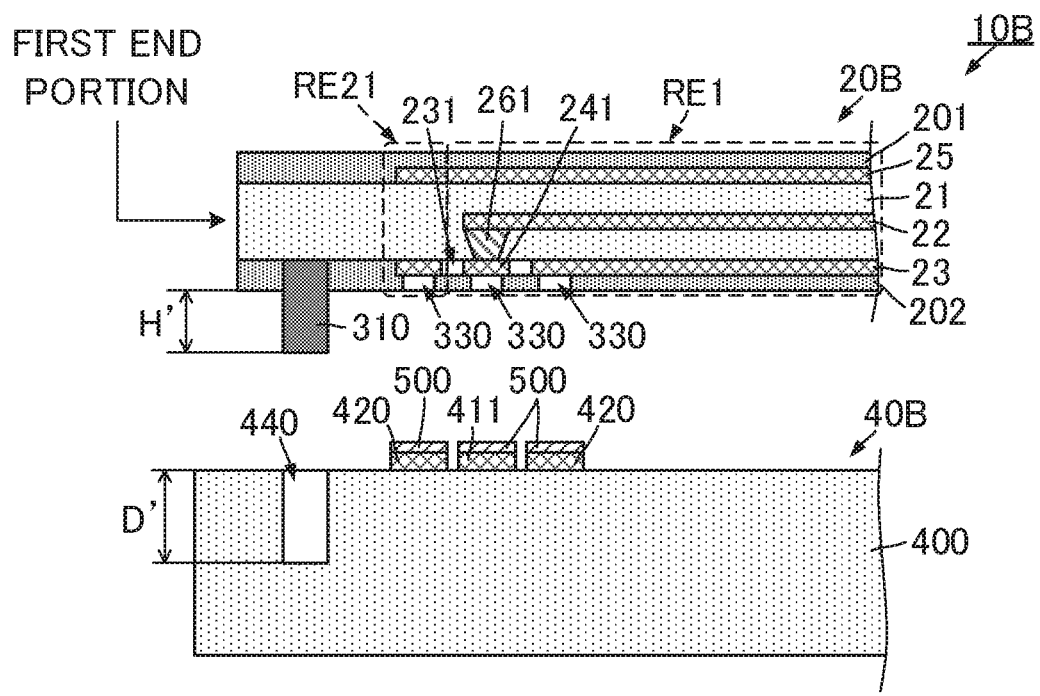
FIG. 8 is an enlarged sectional side view of a vicinity of a portion in which a flat cable and a mounting board are bonded to each other in a composite substrate according to a third preferred embodiment of the present invention.

Subsequently, a composite substrate according to a third preferred embodiment of the present invention will be described with reference to the drawings. FIG. 8 is an enlarged sectional side view of a vicinity of a portion in which a flat cable and a mounting board are bonded to each other in the composite substrate according to the third preferred embodiment of the present invention.

As shown in FIG. 8, the composite substrate 10B according to the third preferred embodiment of the present invention includes a convex portion 310 provided on a flat cable 20B, and a positioning hole 440 provided in a mounting board 40B. With this exception, the basic configuration of the composite substrate 10B is the same as or similar to the configuration of the composite substrate 10 according to the first preferred embodiment, and a description of the same or similar configuration will be omitted.

The flat cable 20B includes a convex portion 310. The convex portion 310 is disposed between the first end portion and the first bonding portion RE21 of the flat cable 20B. The convex portion 310 projects from the rear surface of the flat cable 20B. This convex portion 310 corresponds to "the first positioning member". It is to be noted that, although not shown, a convex portion having the same or substantially the same shape as the convex portion 310 and being provided at the second end portion of the flat cable 20B corresponds to "the second positioning portion".

The mounting board 40B includes a positioning hole 440. The positioning hole 440 is concave from the surface of the board body 400. This positioning hole 440 corresponds to "the first mounting board side positioning member". It is to be noted that, although not shown, another positioning hole provided at the second end portion of the mounting board 40B and different from this positioning hole 440 corresponds to "the second mounting board side positioning member".

The convex portion 310 is fitted in the positioning hole 440. As a result, the flat cable 20B is positioned with respect to the mounting board 40B. At this time, the height H' of the convex portion 310 is preferably greater than or equal to one-half and less than or equal to the depth of the depth D' of the positioning hole 440. Similarly, the positioning hole provided at the second end portion of the mounting board 40B also preferably has the same or substantially the same dimension as the positioning hole 440.

Even with such a configuration, similarly to the first preferred embodiment, while the flat cable 20B has desired electrical characteristics, the composite substrate 10B with the high reliability of bonding the flat cable 20B and the mounting board 40B is able to be obtained.

Figure 9A:
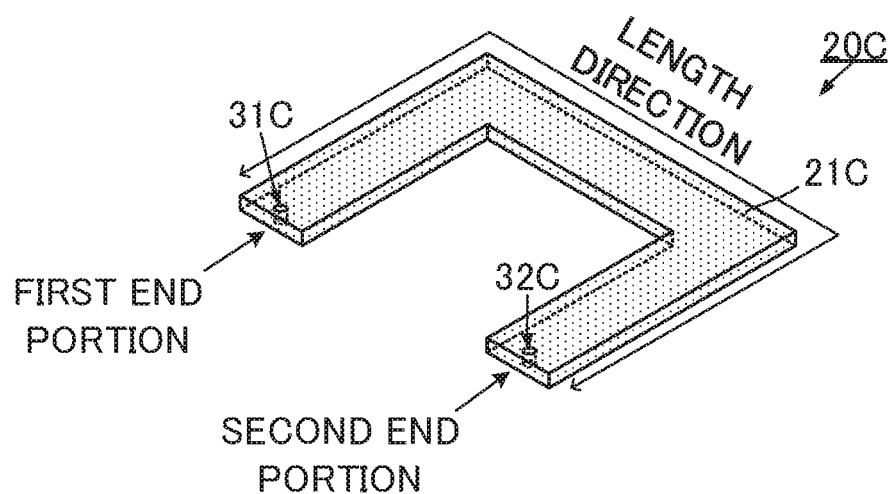
FIG. 9A is an external perspective view of a flat cable of a composite substrate according to a fourth preferred embodiment of the present invention.

Subsequently, a composite substrate according to a fourth preferred embodiment of the present invention will be described with reference to the drawings. FIG. 9A is an external perspective view of a flat cable of the composite substrate according to the fourth preferred embodiment of the present invention, and FIG. 9B is a plan view of the flat cable of the composite substrate according to the fourth preferred embodiment of the present invention.

Figure 9B:
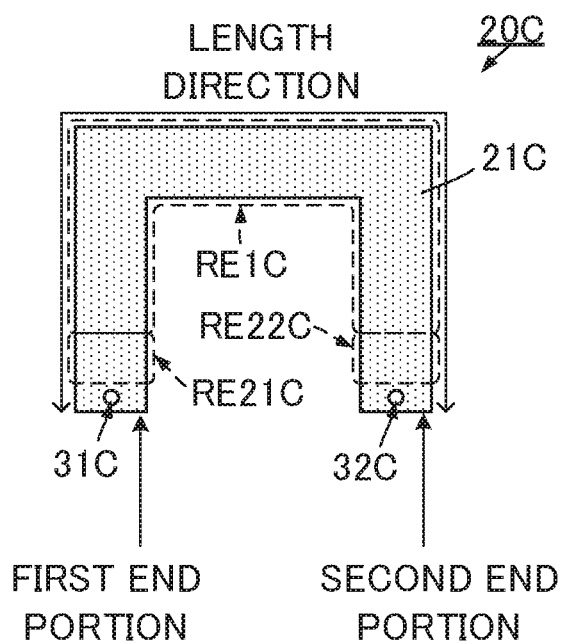
FIG. 9B is a plan view of the flat cable of the composite substrate according to the fourth preferred embodiment of the present invention.

As shown in FIGS. 9A and 9B, the flat cable 20C according to the fourth preferred embodiment is different from the flat cable 20 in that the flat cable 20C is bent in a middle portion in the length direction. Other basic configurations are the same as or similar to the configurations of the flat cable 20 according to the first preferred embodiment.

The flat cable 20C includes a first bonding portion RE21C, a circuit portion RE1C, and a second bonding portion RE22C in this order in the length direction from a first end portion toward a second end portion. The first bonding portion RE21C and the second bonding portion RE22C are portions to be bonded to a mounting board which is not shown. The circuit portion RE1C includes a passive element (such as a capacitor, and a coil, for example) defined by a conductor pattern (not shown) provided in a flexible insulating base material 21C. The circuit portion RE1C includes a corner portion at which the direction in the length direction changes, in the middle portion in the length direction.

The positioning hole 31C is disposed between the first end portion and the first bonding portion RE21C of the flat cable 20C, in the length direction of the flat cable 20C (the flexible insulating base material 21C). The positioning hole 32C is disposed between the second end portion and the second bonding portion RE22C of the flat cable 20C, in the length direction of the flat cable 20C (the flexible insulating base material 21C).

In a configuration including a corner portion in the middle portion in the length direction, it is easy to deform from the corner portion as a starting point. However, with positioning members including the positioning hole and the convex portion, while having desired electrical characteristics in the circuit portion, the composite substrate with the high reliability of bonding the flat cable 20C and the mounting board is able to be obtained. It is to be noted that, while the corner portion is provided in the middle portion in the length direction of the flat cable 20C (the flexible insulating base material 21C) in the fourth preferred embodiment, a curved portion that changes a direction in the length direction may be provided or the corner portion and the curved portion may be combined. Even in such a case, the same or substantially the same advantageous effect is able to be obtained as in the fourth preferred embodiment.

Figure 10:
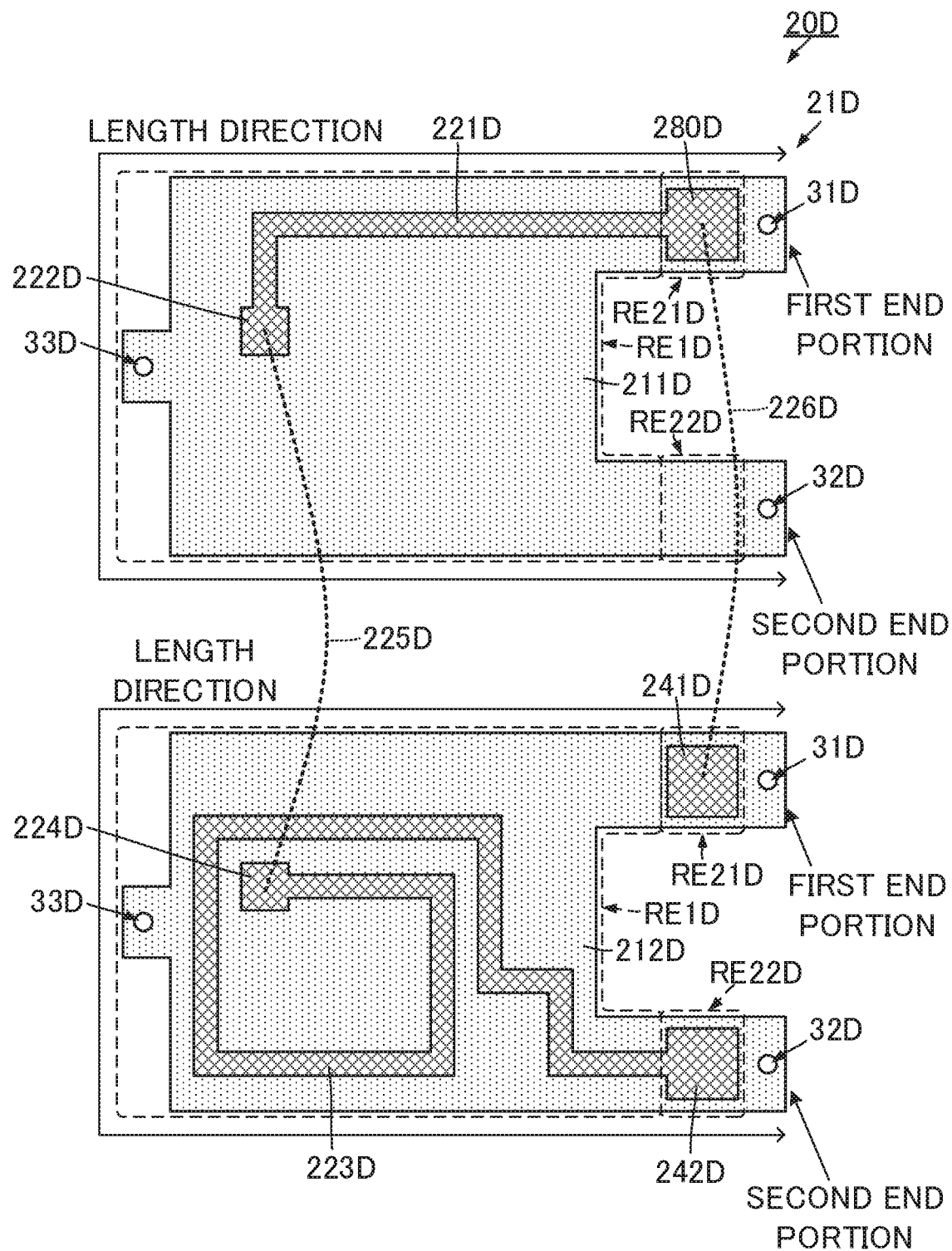
FIG. 10 is an exploded plan view of a flat cable of a composite substrate according to a fifth preferred embodiment of the present invention.

Subsequently, a composite substrate according to a fifth preferred embodiment of the present invention will be described with reference to the drawings. FIG. 10 is an exploded plan view of a flat cable of the composite substrate according to the fifth preferred embodiment of the present invention.

As shown in FIG. 10, the flat cable 20D of the composite substrate according to the fifth preferred embodiment as well as the flat cable 20C according to the fourth preferred embodiment, is bent in a middle portion in the length direction. The external shape of the flat cable 20D of the composite substrate according to the fifth preferred embodiment is the same as or similar to the external shape of the flat cable 20C according to the fourth preferred embodiment, and includes an auxiliary projecting portion that projects in a direction perpendicular or substantially perpendicular to the length direction and the thickness direction, in the middle portion in the length direction.

The flexible insulating base material 21D is a stacked body including the base material layers 211D and 212D. The base material layers 211D and 212D are preferably made of a thermoplastic resin, for example. The base material layers 211D and 212D are bent in the middle portion in the length direction. In other words, the flexible insulating base material 21D is bent in the middle portion in the length direction.

The flat cable 20D includes a first bonding portion RE21D, a circuit portion RE1D, and a second bonding portion RE22D in this order in the length direction from a first end portion toward a second end portion. The first bonding portion RE21D includes an external connection conductor 241D and bonded to a not-shown mounting board. The second bonding portion RE22D includes an external connection conductor 242D and bonded to a not-shown mounting board.

The first bonding portion RE21D of the base material layers 211D includes an auxiliary conductor 280D. The auxiliary conductor 280D is connected to the external connection conductor 241D of the base material layer 212D through an interlayer connection conductor 226D.

The circuit portion RE1D of the base material layers 211D includes a conductor pattern 221D, and a pad conductor 222D for interlayer connection. The one end of the conductor pattern 221D is connected to the auxiliary conductor 280D, and another end of the conductor pattern 221D is connected to the pad conductor 222D.

The first bonding portion RE21D of the base material layers 212D includes the external connection conductor 241D. The second bonding portion RE22D of the base material layers 212D includes the external connection conductor 242D. The circuit portion RE1D of the base material layers 212D includes a coil conductor pattern 223D, and a pad conductor 224D for interlayer connection. The one end of the coil conductor pattern 223D is connected to the external connection conductor 242D, and another end of the coil conductor pattern 223D is connected to the pad conductor 224D. The pad conductor 224D and the pad conductor 222D are connected through an interlayer connection conductor 225D. With this configuration, a coil is provided in the circuit portion RE1D.

The positioning hole 31D is disposed between the first end portion and the first bonding portion RE21D of the flat cable 20D, in the length direction of the flat cable 20D (the flexible insulating base material 21D). The positioning hole 32D is disposed between the second end portion and the second bonding portion RE22D of the flat cable 20D, in the length direction of the flat cable 20D (the flexible insulating base material 21D).

Even in such a configuration, while having desired electrical characteristics in the circuit portion, the composite substrate with the high reliability of bonding the flat cable 20D and the mounting board is able to be obtained.

Further, the flat cable 20D includes an auxiliary projecting portion at an intermediate position in the length direction of the circuit portion RE1D. The auxiliary projecting portion includes an auxiliary positioning hole 33D. This auxiliary positioning hole 33D is fitted in a convex portion (not shown) of the mounting board.

With such a configuration, the flat cable 20D is able to be more reliably positioned with respect to the mounting board. In addition, this positioning state is able to be more stably maintained.

In particular, a coil, that generates a magnetic field, is likely to be coupled to other circuit conductors (such as a circuit conductor provided on a mounting board). However, with the configuration of the fifth preferred embodiment, a coil is able to be disposed at a desired position of a mounting board. Therefore, a change in characteristics of the coil due to mounting of the coil to the mounting board is able to be significantly reduced or prevented more reliably.

Figure 11:
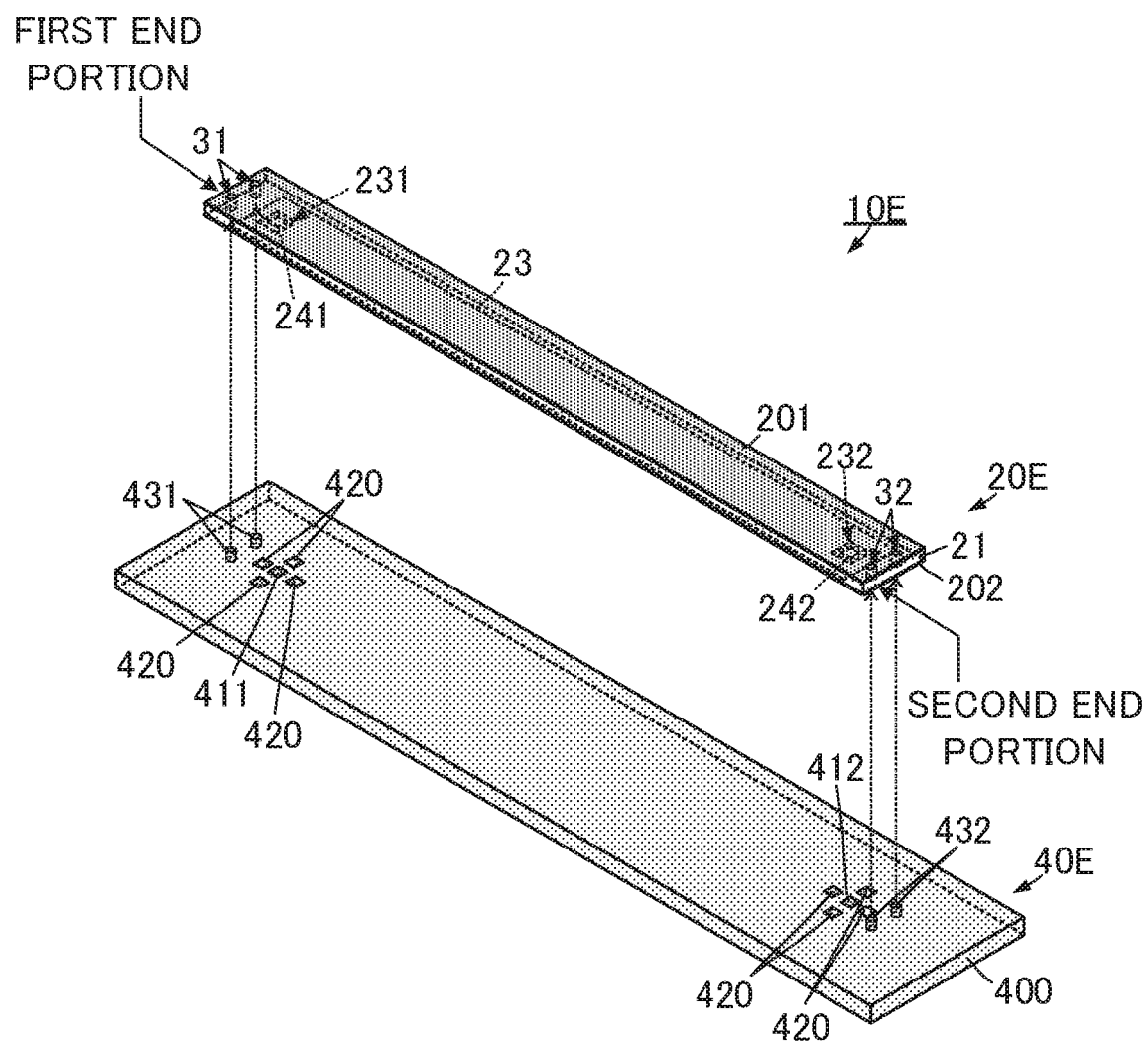
FIG. 11 is an exploded perspective view of a composite substrate according to a sixth preferred embodiment of the present invention.

Subsequently, a composite substrate according to a sixth preferred embodiment of the present invention will be described with reference to the drawings. FIG. 11 is an exploded perspective view of the composite substrate according to the sixth preferred embodiment of the present invention.

As shown in FIG. 11, the composite substrate 10E according to the sixth preferred embodiment is different from the composite substrate 10 according to the first preferred embodiment in the number of positioning holes and convex portions.

A flat cable 20E according to the sixth preferred embodiment is different from the flat cable 20 according to the first preferred embodiment in that a plurality of positioning holes 31 and 32 are provided. A mounting board 40E according to the sixth preferred embodiment is different from the mounting board 40 according to the first preferred embodiment in that a plurality of convex portions 431 and 432 are provided. Other configurations are the same as or similar to the configurations of the composite substrate and the flat cable according to the first preferred embodiment, and a description of the same or similar configuration will be omitted.

The flat cable 20E includes a plurality of positioning holes 31 and a plurality of positioning holes 32. The plurality of positioning holes 31 are disposed between the first end portion and the first bonding portion RE21 (see FIGS. 4A and 4B) in the length direction of the flat cable 20E (the flexible insulating base material 21). The plurality of positioning holes 32 are disposed between the second end portion and the second bonding portion RE22 (see FIGS. 4A and 4B) in the length direction of the flat cable 20E (the flexible insulating base material 21).

The mounting board 40E includes a plurality of convex portions 431 and 432. The plurality of convex portions 431 are respectively fitted in the plurality of positioning holes 31. The plurality of convex portions 432 are respectively fitted in the plurality of positioning holes 32.

With such a configuration, a positioning state in which the flat cable 20E is positioned on the mounting board 40E is able to be more reliably maintained.

Figure 12A:
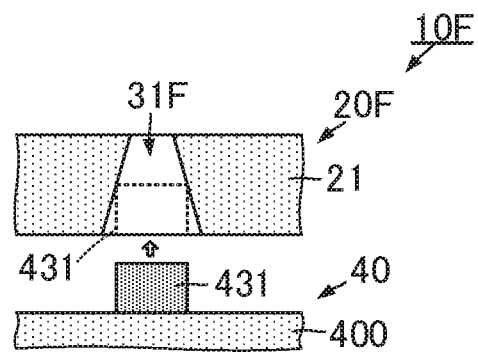
FIGS. 12A to 12C are partial sectional views showing various structures of a positioning member of a composite substrate according to a seventh preferred embodiment of the present invention.
Figure 12B:
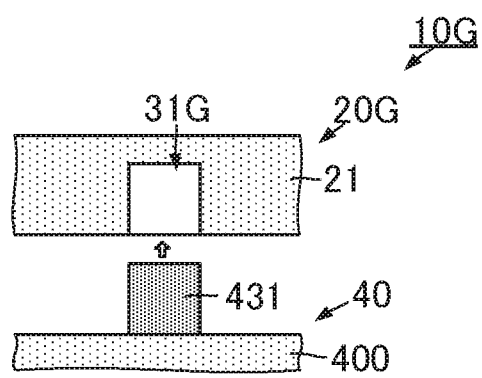
Figure 12C:
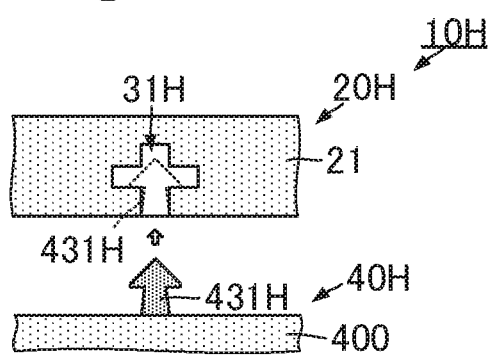

Subsequently, a composite substrate according to a seventh preferred embodiment of the present invention will be described with reference to the drawings. FIGS. 12A to 12C are partial sectional views showing various structures of a positioning member of the composite substrate according to the seventh preferred embodiment of the present invention.

The composite substrates 10F, 10G, and 10H according to the seventh preferred embodiment are different from the composite substrate 10 according to the first preferred embodiment in the positioning member. Other basic configurations are the same as or similar to the configurations of the composite substrate 10 according to the first preferred embodiment, and a description of the same or substantially the same configuration will be omitted. In addition, although FIG. 12A to FIG. 12C show only the side of the first end portion, the side of the second end portion also has the same or substantially the same structure.

As shown in FIG. 12A, the composite substrate 10F includes a flat cable 20F including a positioning hole 31F. In the positioning hole 31F, an opening area on the side of the mounting board 40 is larger than an opening area on the side opposite to the mounting board 40. The diameter of an opening on the side of the mounting board 40 in the positioning hole 31F is larger than the diameter of the convex portion 431. The diameter of an opening on the side opposite to the mounting board 40 in the positioning hole 31F is smaller than the diameter of the convex portion 431. With such a configuration, the tip of the convex portion 431 is in contact with and fixed to the wall surface of the positioning hole 31F in a middle portion in the thickness direction of the positioning hole 31F. Therefore, the convex portion 431 is able to adjust the height to be fitted in the positioning hole 31F.

Thus, for example, the flat cable 20F and the mounting board 40 are easily disposed to be flush or substantially flush with each other, which makes it possible to easily obtain a low profile composite substrate 10F. In addition, with such a configuration, the convex portion 431 is easily inserted to the positioning hole 31F, and the convex portion 431 is fixed at a desired position of the positioning hole 31F by a self-alignment effect. As a result, positioning is able to be easily and accurately performed.

As shown in FIG. 12B, the composite substrate 10G includes a flat cable 20G including a positioning hole 31G. The positioning hole 31G is open only to the side of the mounting board 40 of the flat cable 20G. With such a configuration, it becomes possible to limit the amount of the convex portion 431 to be fitted in the positioning hole 31G.

As shown in FIG. 12C, the composite substrate 10H includes a flat cable 20H including a positioning hole 31H. The positioning hole 31H includes a plurality of portions with different inner diameters, and the plurality of portions include a wide portion and a narrow portion. The wide portion includes a portion of which the width is large, at an intermediate point in the thickness direction in the flexible insulating base material 21, and the narrow portion includes two narrow portions having a width smaller than the width of the wide portion and being located on the side of the opening of the positioning hole 31H and on the side opposite to the opening.

As shown in FIG. 12C, a mounting board 40H includes a convex portion 431H. The convex portion 431H includes a plurality of portions with different diameters, and the plurality of portions include a first portion and a second portion. The width of the first portion connected to the board body 400 in the convex portion 431H is relatively small, and the width of the second portion spaced apart from the board body 400 is relatively large.

In such a configuration, when the convex portion 431H is fitted in the positioning hole 31H, the second portion of the convex portion 431H is disposed in the wide portion of the positioning hole 31H. As a result, the second portion of the convex portion 431H is retained by the narrow portion on the side of the opening of the positioning hole 31H, and thus the convex portion 431H is unlikely to detach from the positioning hole 31H.

Therefore, a positioning state in which the flat cable 20H is positioned on the mounting board 40H is able to be more reliably maintained.

Figure 13A:
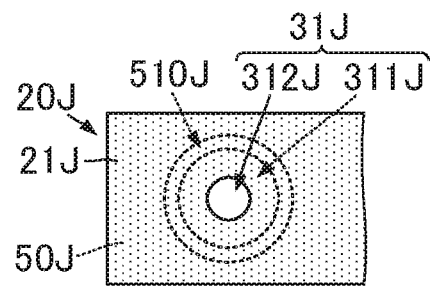
FIG. 13A is a plan view of a portion of a vicinity of a first end portion of a flat cable according to an eighth preferred embodiment of the present invention, as viewed from a side of a front surface.
Figure 13B:
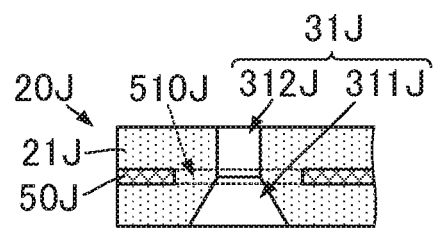
FIG. 13B is a sectional side view of the vicinity of the first end portion of the flat cable according to the eighth preferred embodiment of the present invention.
Figure 13C:
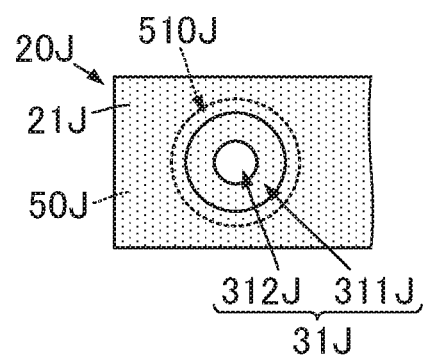
FIG. 13C is a plan view of the flat cable according to the eighth preferred embodiment of the present invention, as viewed from a side of a rear surface.
Figure 14:
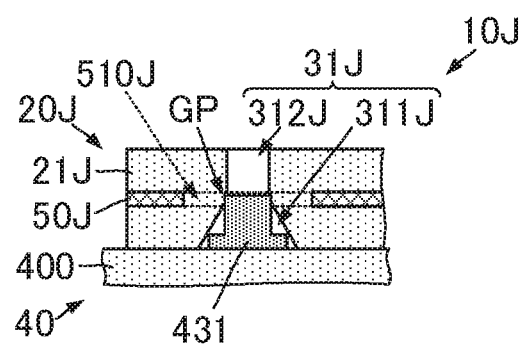
FIG. 14 is a sectional side view of a state in which the flat cable according to the eighth preferred embodiment of the present invention is fixed to a mounting board.

Subsequently, a flat cable of a composite substrate according to an eighth preferred embodiment of the present invention will be described with reference to the drawings. FIG. 13A is a plan view of a portion of a vicinity of a first end portion of the flat cable according to the eighth preferred embodiment of the present invention, as viewed from a side of a front surface, FIG. 13B is a sectional side view of the vicinity of the first end portion of the flat cable according to the eighth preferred embodiment of the present invention, and FIG. 13C is a plan view of the flat cable according to the eighth preferred embodiment of the present invention, as viewed from a side of a rear surface. FIG. 14 is a sectional side view of a state in which the flat cable according to the eighth preferred embodiment of the present invention is fixed to a mounting board.

As shown in FIG. 14, the composite substrate 10J according to the eighth preferred embodiment includes the flat cable 20J and the mounting board 40. The mounting board 40 is the same or substantially the same as the mounting board 40 according to the first preferred embodiment. The flat cable 20J is different from the flat cable 20 according to the first preferred embodiment in that the shape of a positioning hole 31J is different and an auxiliary conductor 50J for a positioning hole is included. The other configurations of the flat cable 20J are the same as or similar to the configurations of the flat cable 20, and a description of the same or similar configuration will be omitted. It is to be noted that, in the drawings and the description of the eighth preferred embodiment, a flexible insulating base material 21J used for the flat cable 20J is shown as including two base material layers. However, such an illustration is to describe the characteristic configuration of the eighth preferred embodiment in an easily understandable manner. Therefore, even when the number of base material layers of the flexible insulating base material 21J is different from the number of base material layers of the flexible insulating base material 21, the characteristic configuration of the eighth preferred embodiment is applicable to the flexible insulating base material 21. Furthermore, the characteristic configuration of the eighth preferred embodiment is also applicable to a flexible insulating base material according to other preferred embodiments of the present invention.

In addition, in the eighth preferred embodiment, although only the first end portion of the flat cable 20J is shown, the second end portion also has the same or substantially the same structure.

The flat cable 20J includes the flexible insulating base material 21J. The flexible insulating base material 21J includes a positioning hole 31J and an auxiliary conductor 50J in the vicinity of the first end portion.

The auxiliary conductor 50J is provided in the vicinity of the first end portion in the flexible insulating base material 21J. More specifically, the auxiliary conductor 50J is provided in an area between the first end portion and the first bonding portion (not shown: see the first bonding portion RE21 of FIGS. 4A and 4B) in the flexible insulating base material 21J. The auxiliary conductor 50J extends over the entire or substantially the entire area in a plan view. The auxiliary conductor 50J is not connected to other conductors of the flexible insulating base material 21J. Further, the auxiliary conductor 50J is preferably not located in proximity to a signal conductor (the conductor pattern 22 as shown in FIG. 3, for example). In the eighth preferred embodiment, a position located in proximity to a signal conductor means a position at which electromagnetic field coupling to the signal conductor is difficult.

The auxiliary conductor 50J includes an opening 510J. The opening 510J preferably has a circular or substantially circular shape in a plan view, for example, and is a hole that penetrates the auxiliary conductor 50J in the thickness direction.

The positioning hole 31J is provided in the vicinity of the first end portion in the flexible insulating base material 21J. More specifically, the positioning hole 31J is provided in an area between the first end portion and the first bonding portion (not shown: see the first bonding portion RE21 of FIGS. 4A and 4B) in the flexible insulating base material 21J. The positioning hole 31J is provided at a position in the opening 510J of the auxiliary conductor 50J in a plan view. In other words, the auxiliary conductor 50J surrounds or substantially surrounds the positioning hole 31J in a plan view. The positioning hole 31J penetrates the flexible insulating base material 21J in the thickness direction.

The positioning hole 31J includes a first portion 311J and a second portion 312J. The first portion 311J and the second portion 312J communicate with each other. The first portion 311J is open to the side of the rear surface of the flexible insulating base material 21J. The second portion 312J is open to the side of the front surface of the flexible insulating base material 21J.

The first portion 311J preferably has a columnar shape of which the plane cross sectional area (the plane area of the first portion 311J when being cut by a plane perpendicular or substantially perpendicular to the thickness direction of the flexible insulating base material 21J) gradually decreases from the rear surface toward the middle position in the thickness direction of the flexible insulating base material 21J, in the thickness direction of the flexible insulating base material 21J. In other words, as shown in FIG. 13B, the cross section of the first portion 311J preferably has a trapezoidal shape. The second portion 312J preferably has a columnar shape with the same or substantially the same inner diameter at any position in the thickness direction of the flexible insulating base material 21J. In other words, as shown in FIG. 13B, the cross section of the second portion 312J preferably has a rectangular shape. In a plan view, the center or approximate center of the first portion 311J and the center or approximate center of the second portion 312J are aligned or substantially aligned with each other.

It is to be noted that the plane cross sectional shape (the shape obtained by cutting the positioning hole 31J by a plane perpendicular or substantially perpendicular to the thickness direction of the flexible insulating base material 21J) of the positioning hole 31J may not be a circle or substantially a circle. For example, the plane cross sectional shape of the positioning hole 31J may be an ellipse or a polygon.

With such a configuration, as shown in FIG. 14, the convex portion 431 of the mounting board 40 is securely fitted in the positioning hole 31J and is fixed in the positioning hole 31J. In addition, the inner diameter of the positioning hole 31J gradually decreases from the rear surface of the flexible insulating base material 21J to which the convex portion 431 is to be inserted, toward the center in the thickness direction. Therefore, the convex portion 431 is easily inserted to the positioning hole 31J. Further, by a self-alignment effect, the convex portion 431 is guided to the center or approximate center of the positioning hole 31J in a plan view. As a result, the flat cable 20J is able to be easily and accurately positioned with respect to the mounting board 40.

Further, the diameter of the convex portion 431 is preferably larger than the diameter of the second portion 312J of the positioning hole 31J in the flexible insulating base material 21J of the flat cable 20J, so that, as shown in GP of FIG. 14, the convex portion 431 is engaged with the wall surface of the positioning hole 31J and fixed. As a result, the fixing strength between the flat cable 20J and the mounting board 40 by the positioning hole 31J and the convex portion 431 is improved. Therefore, at a time of subsequent bonding of the first bonding portion and the second bonding portion, the flat cable 20J is unlikely to detach from the mounting board 40.

Figure 15:
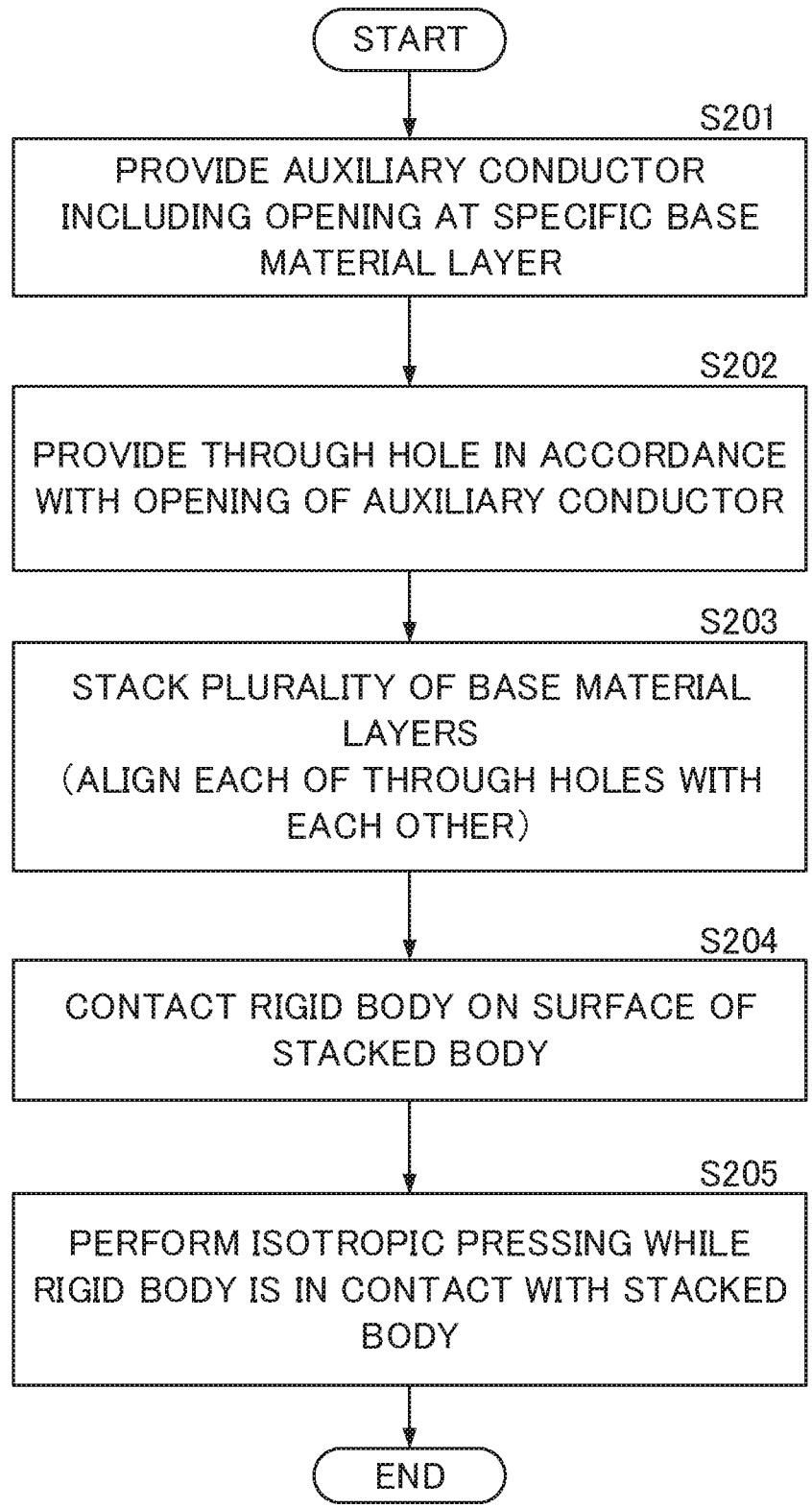
FIG. 15 is a flow chart of a first method of manufacturing the flat cable according to the eighth preferred embodiment of the present invention.
Figure 16:
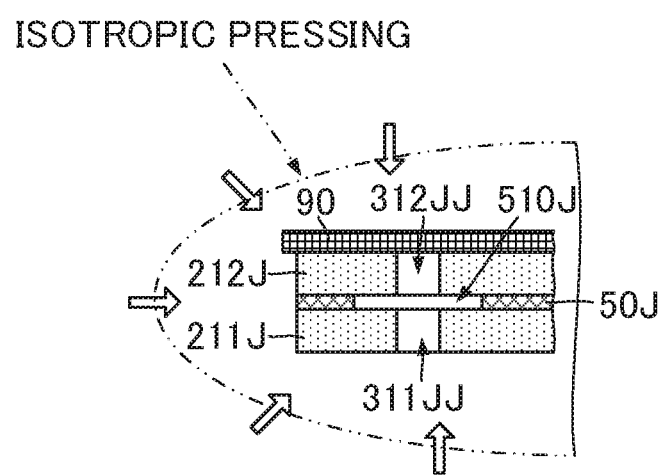
FIG. 16 is a sectional side view showing a state during isotropic pressing in a method of manufacturing the flat cable according to the eighth preferred embodiment of the present invention.

The flat cable 20J having such a configuration may be manufactured by the following manufacturing method. FIG. 15 is a flow chart of a first method of manufacturing the flat cable according to the eighth preferred embodiment of the present invention. FIG. 16 is a sectional side view showing a state during isotropic pressing in a method of manufacturing the flat cable according to the eighth preferred embodiment of the present invention. It is to be noted that the through holes 311JJ and 312JJ in FIG. 16 respectively correspond to the center or approximate center of the first portion 311J and the second portion 312J in a state before the stacked body is subjected to heating and isotropic pressing.

First, the auxiliary conductor 50J including the opening 510J is provided on a specific base material layer (the base material layer 211J shown in FIG. 16) (S201). The auxiliary conductor 50J including the opening 510J is provided by performing pattern etching to a conductor attached to the specific base material layer.

Next, in accordance with the opening 510J of the auxiliary conductor 50J, a through hole is respectively provided in each base material layer (the base material layers 211J and 212J shown in FIG. 16) (S202). Specifically, in the case of a specific base material layer (the base material layer 211J shown in FIG. 16), a through hole (the through hole 311JJ shown in FIG. 16) is provided at a position (the center or approximate center of the opening 510J) that overlaps with the opening 510J. Specifically, in the case of another base material layer, a through hole (the through hole 312JJ shown in FIG. 16) is provided at a position (the center or approximate center of the opening 510J) that overlaps with the opening 510J when the base material layer is stacked with the specific base material layer. At this time, the diameter of each through hole (the through holes 311JJ and 312JJ of FIG. 16) is constant or substantially constant and is the same or substantially the same as the diameter of the second portion 312J at the time of being shaped in the flexible insulating base material 21J.

Subsequently, a plurality of base material layers (the base material layers 211J and 212J shown in FIG. 16) are stacked on each other (S203). At this time, the plurality of base material layers are stacked so that the positions of each through hole is aligned with each other in a plan view.

Subsequently, a rigid body 90 is brought into contact with the surface of the stacked body (the surface on the side of the base material layer 212J shown in FIG. 16) (S204). The rigid body 90 is in contact with the entire or substantially the entire surface of the stacked body. Then, while the rigid body 90 is in contact with the surface of the stacked body, as shown in FIG. 16, heating and isotropic pressing are performed (S205).

With such a manufacturing method, since the auxiliary conductor 50J is provided at the time of heating and isotropic pressing, the base material layer 211J with which the rigid body 90 is not in contact is more likely to deform than the base material layer 212J with which the rigid body 90 is in contact. As a result, the through hole provided in the base material layer 211J deforms, and the first portion 311J of the positioning hole 31J is provided. On the other hand, the amount of deformation of the through hole provided in the base material layer 212J is small, and the second portion 312J of the positioning hole 31J is provided.

In this manner, with the manufacturing method according to the eighth preferred embodiment, the positioning hole 31J that changes in shape at an intermediate position in the thickness direction is able to be easily manufactured.

Figure 17:
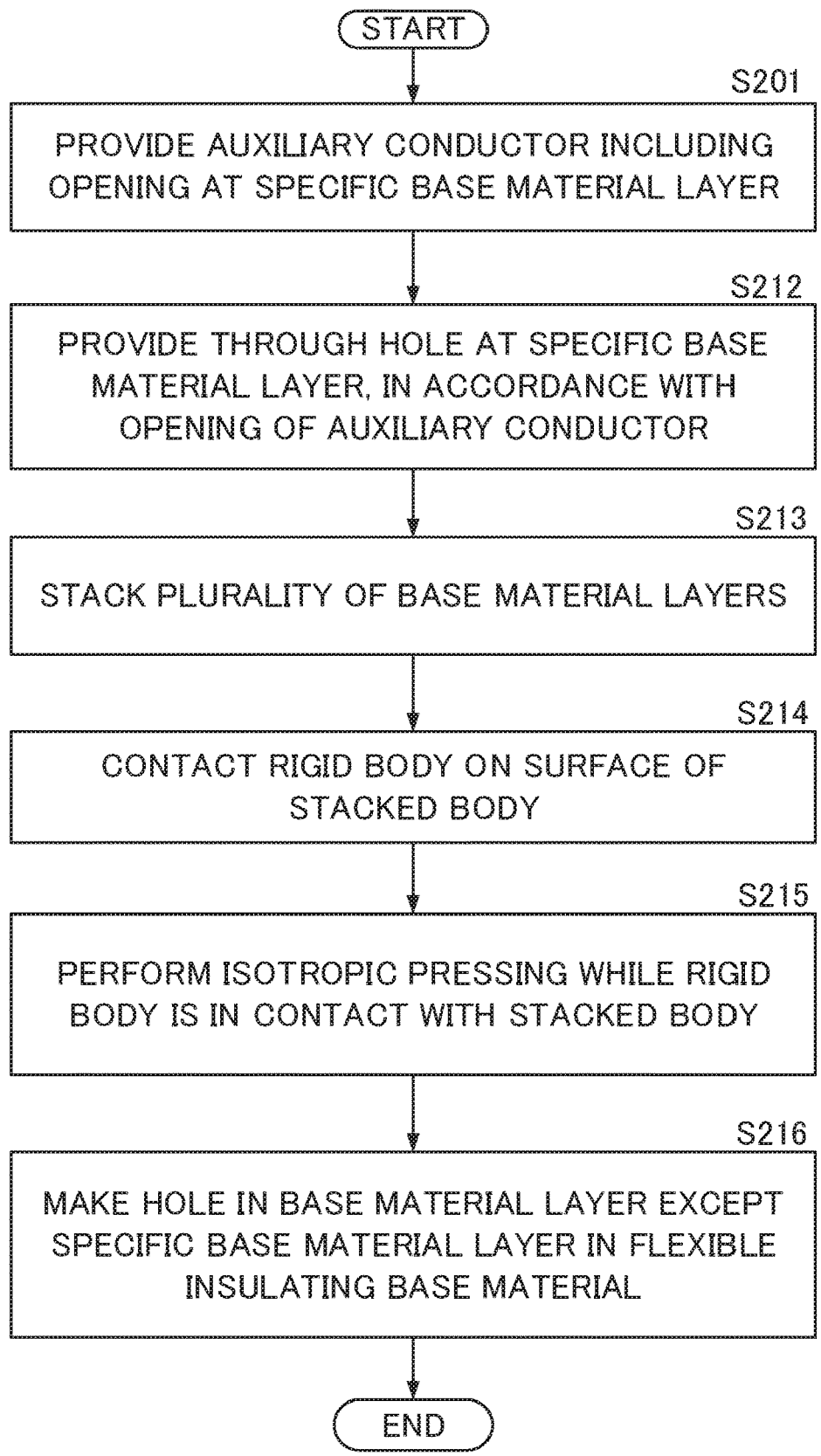
FIG. 17 is a flow chart of a second method of manufacturing the flat cable according to the eighth preferred embodiment of the present invention.

The positioning hole 31J is also able to be manufactured by the following manufacturing method. FIG. 17 is a flow chart of a second method of manufacturing the flat cable according to the eighth preferred embodiment of the present invention.

The second manufacturing method shown in FIG. 17 is different from the first manufacturing method shown in FIG. 15 in that a through hole is provided only in a specific base material layer. The final shapes of the positioning hole 31J by the first manufacturing method and the second manufacturing method are the same or substantially the same.

First, the auxiliary conductor 50J including the opening 510J is provided on a specific base material layer (the base material layer 211J shown in FIG. 16) (S201).

Next, in accordance with the opening 510J of the auxiliary conductor 50J, a through hole is provided at a position (the center or approximate center of the opening 510J) of a specific base material layer (the base material layer 211J shown in FIG. 16), the position overlapping with the opening 510J (S212).

Subsequently, a plurality of base material layers are stacked on one another (S213). Then, a rigid body 90 is brought into contact with the surface of the stacked body (S214). The rigid body 90 is in contact with the entire or substantially the entire surface of the stacked body. Then, while the rigid body 90 is in contact with the surface of the stacked body, as shown in FIG. 16, heating and isotropic pressing are performed (S215). By this heating and isotropic pressing, the first portion 311J of the positioning hole 31J is provided.

Subsequently, a through hole is provided by laser or other suitable method at a position that overlaps with the first portion 311J, in the stacked body to which the heating and isotropic pressing have been performed, that is, in the flexible insulating base material (S216). The second portion 312J of the positioning hole 31J is provided by this through hole.

Even with such a manufacturing method, the positioning hole 31J is able to be easily provided.

Figure 18:
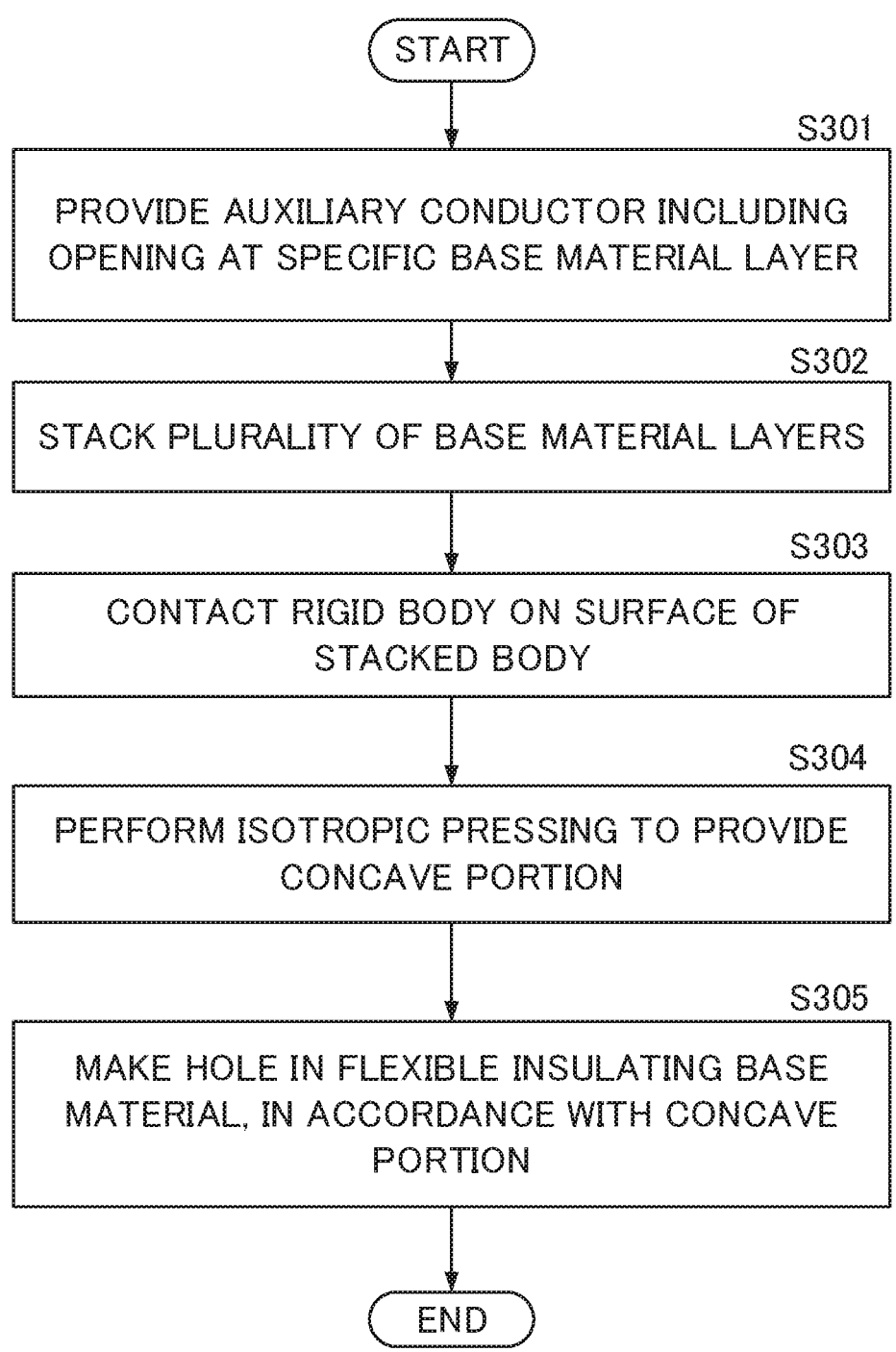
FIG. 18 is a flow chart of a third method of manufacturing the flat cable according to the eighth preferred embodiment of the present invention.
Figure 19A:
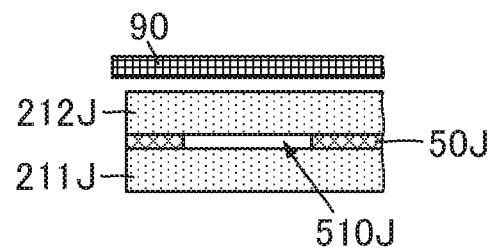
FIGS. 19A to 19C are sectional side views in a plurality of steps in the third method of manufacturing the flat cable according to the eighth preferred embodiment of the present invention.
Figure 19B:
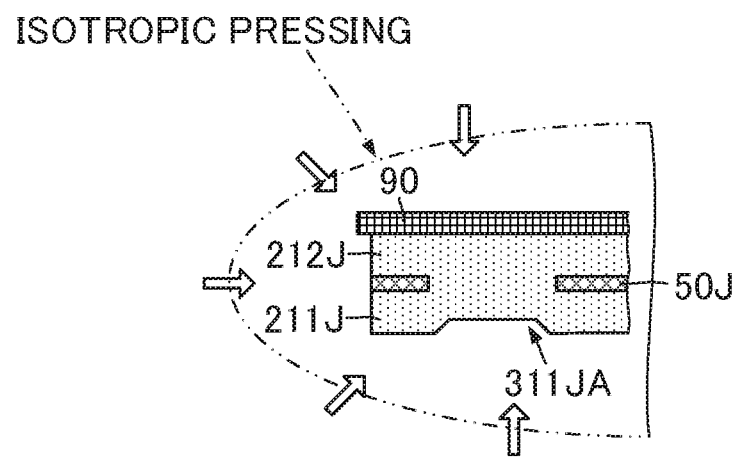
Figure 19C:
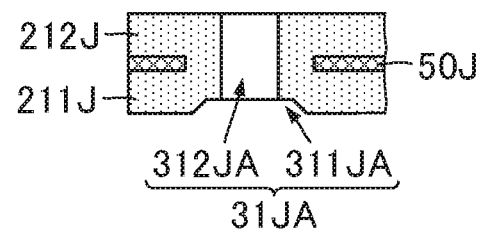

In addition, the positioning hole is also able to be manufactured by the following manufacturing method. FIG. 18 is a flow chart of a third method of manufacturing the flat cable according to the eighth preferred embodiment of the present invention. FIGS. 19A to 19C are sectional side views of a plurality of steps in the third method of manufacturing the flat cable according to the eighth preferred embodiment of the present invention. FIG. 19A shows a state before stacking layers, FIG. 19B shows a state during isotropic pressing, and FIG. 19C shows a completed state.

First, the auxiliary conductor 50J including the opening 510J is provided on the base material layer 211J (S301).

Subsequently, as shown in FIG. 19A, the base material layer 211J and the base material layer 212J are stacked on each other to obtain a stacked body defining and functioning as a base for a flexible insulating base material (S302). A plate-shaped rigid body 90 is disposed on the surface of this stacked body, on the side of the base material layer 212J (S303).

Subsequently, as shown in FIG. 19B, the isotropic pressing is performed to this stacked body to obtain a first portion 311JA that is concave from the surface of the stacked body to which the heating and isotropic pressing have been performed, that is, the flexible insulating base material, the surface being on the side of the base material layer 211J (S304).

Subsequently, as shown in FIG. 19C, in accordance with a concave portion (the first portion 311JA) of the flexible insulating base material, a second portion 312JA including a through hole is provided (S305). As a result, the positioning hole 31JA including a first portion 311JA and a second portion 312JA is provided.

In this manufacturing method, since the second portion 312JA is provided after the first portion 311JA is provided in accordance with the first portion 311JA, positional misalignment between the first portion 311JA and the second portion 312JA is able to be significantly reduced or prevented from occurring.

Figure 20A:
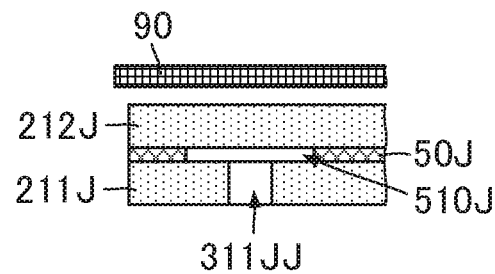
FIGS. 20A to 20C are sectional side views in a plurality of steps in a fourth method of manufacturing the flat cable according to the eighth preferred embodiment of the present invention.
Figure 20B:
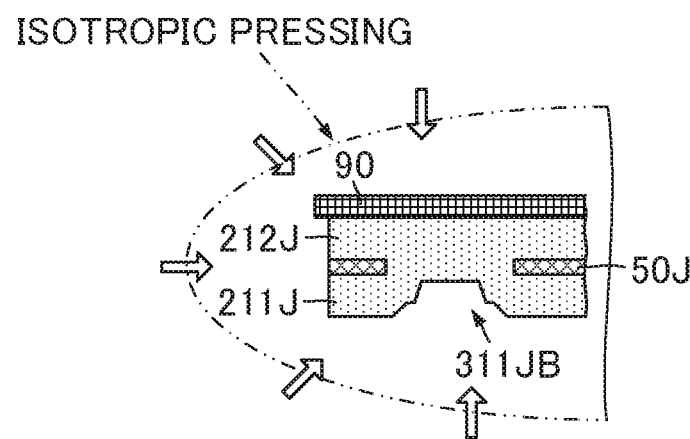
Figure 20C:
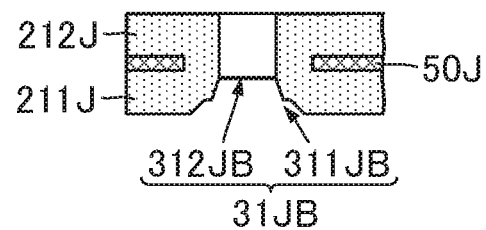

In addition, the positioning hole is also able to be manufactured by the following manufacturing method. FIGS. 20A to 20C are sectional side views in a plurality of steps in a fourth method of manufacturing the flat cable according to the eighth preferred embodiment of the present invention. FIG. 20A shows a state before stacking the layers, FIG. 20B shows a state during isotropic pressing, and FIG. 20C shows a completed state.

The manufacturing method shown in FIGS. 20A to 20C is obtained by combining the method of providing the through hole 311JJ in the base material layer 211J, shown in FIG. 16, and the manufacturing method as shown in to FIG. 18 and FIGS. 19A to 19C.

First, the auxiliary conductor 50J including the opening 510J is provided on the base material layer 211J. In addition, a through hole 311JJ is provided in the base material layer 211J in accordance with the opening 510J of the auxiliary conductor 50J.

Subsequently, as shown in FIG. 20A, the base material layer 211J and the base material layer 212J are stacked on each other (S302) to obtain a stacked body defining and functioning as a base for a flexible insulating base material. A plate-shaped rigid body 90 is disposed on the surface of this stacked body, on the side of the base material layer 212J (S303).

Subsequently, as shown in FIG. 20B, the isotropic pressing is performed to the stacked body to obtain a first portion 311JB that is concave from the surface of the stacked body to which the heating and isotropic pressing have been performed, that is, the flexible insulating base material, the surface being on the side of the base material layer 211J (S304). The first portion 311JB is provided by overlapping the through hole 311JJ with a concave portion due to deformation of the base material layer 211J by isotropic pressing.

Subsequently, as shown in FIG. 20C, in accordance with the first portion 311JB of the flexible insulating base material, a second portion 312JB including a through hole is provided. As a result, the positioning hole 31JB including a first portion 311JB and a second portion 312JB is provided (S305).

Figure 21:
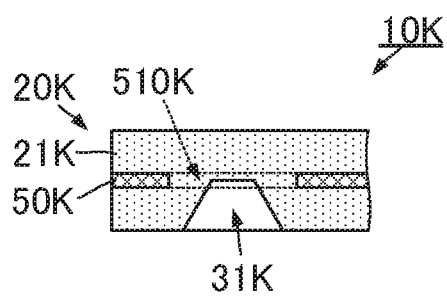
FIG. 21 is a sectional side view of a vicinity of a first end portion of a flat cable according to a ninth preferred embodiment of the present invention.

Subsequently, a flat cable according to a ninth preferred embodiment of the present invention will be described with reference to the drawings. FIG. 21 is a sectional side view of a vicinity of a first end portion of the flat cable according to the ninth preferred embodiment of the present invention.

A flat cable 20K according to the ninth preferred embodiment is different from the flat cable 20J according to the eighth preferred embodiment in the shape of a positioning hole 31K. The other configurations (such as an auxiliary conductor 50K and an opening 510K, for example) of the flat cable 20K are the same as or similar to the configurations of the flat cable 20J, and a description of the same or similar configuration will be omitted.

The positioning hole 31K is a positioning hole that is concave from the rear surface of a flexible insulating base material 21K, and does not penetrate the flexible insulating base material 21K. In other words, the positioning hole 31K is the same or substantially the same as the structure of only the first portion 311J in the positioning hole 31J according to the eighth preferred embodiment.

The positioning hole 31K is able to be manufactured by executing steps from Step S201 to Step S215 in the second manufacturing method as shown in FIG. 17.

Figure 22A:
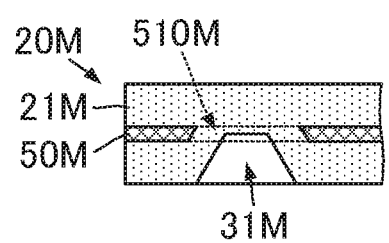
FIG. 22A is a sectional side view of a vicinity of a first end portion of a flat cable according to a tenth preferred embodiment of the present invention.
Figure 22B:
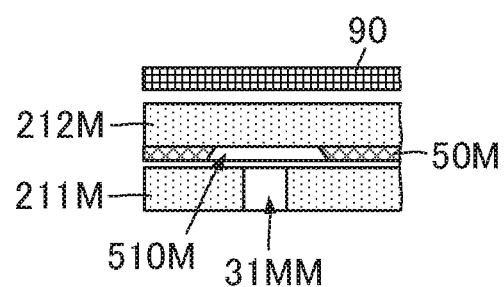
FIG. 22B is a sectional side view of the vicinity of the first end portion at a time of performing isotropic pressing of the flat cable according to the tenth preferred embodiment of the present invention.

Subsequently, a flat cable according to a tenth preferred embodiment of the present invention will be described with reference to the drawings. FIG. 22A is a sectional side view of a vicinity of a first end portion of the flat cable according to the tenth preferred embodiment of the present invention. FIG. 22B is a sectional side view of the vicinity of the first end portion at a time of performing isotropic pressing of the flat cable according to the tenth preferred embodiment of the present invention.

As shown in FIG. 22A, the flat cable 20M according to the tenth preferred embodiment is different from the flat cable 20K according to the ninth preferred embodiment in the shape of an auxiliary conductor 50M.

The auxiliary conductor 50M includes an opening 510M. The opening 510M includes a tapered or substantially tapered wall surface, and the diameter of the opening 510M on the side of the base material layer 211M is larger than the diameter of the opening 510M on the side of the base material layer 212M.

With such a configuration, the base material layer 211M deforms in accordance with the shape (the shape of an end portion on the side of the opening 510M of the auxiliary conductor 50M) of the opening 510M, which makes it easy to provide a positioning hole 31M including a tapered or substantially tapered wall surface of which the diameter of the opening on the rear surface of the flexible insulating base material 21M is larger than the diameter of the bottom surface.

Such a shape is able to be easily obtained by providing the auxiliary conductor 50M in the base material layer 212M adjacent to the base material layer 211M in which a through hole 31MM (a through hole that deforms by heating and isotropic pressing and serves as a positioning hole 31M) is provided as a positioning hole 31M, for example, as shown in FIG. 22B. In other words, an auxiliary conductor 50M without an opening is provided on the surface of the base material layer 212M on the side of the base material layer 211M, and, by increasing the thickness of a photoresist film and performing pattern etching, for example, the shape of the auxiliary conductor 50M including the opening 510M is able to be easily obtained.

It is to be noted that each of the above-described preferred embodiments have described an example in which a positioning hole is disposed at both ends in the length direction of a flat cable (the flexible insulating base material) as an example of a flexible board and a convex portion is disposed on a mounting board, and an example in which a convex portion is disposed at both ends in the length direction of a flat cable (the flexible insulating base material) and a positioning hole is disposed in a mounting board. However, a positioning hole may be disposed at a first end portion in the length direction of a flat cable, a convex portion may be disposed at a second end portion, and a convex portion and a positioning hole may be disposed at a mounting board so as to be fitted to the positioning hole and the convex portion of the flat cable. In addition, the shape of the convex portion of the first end portion and the shape of the convex portion of the second end portion may be different, or the shape of the positioning hole of the first end portion and the shape of the positioning hole of the second end portion may be different. As a result, the flat cable is able to be prevented from being reversely disposed with respect to the mounting board.

In addition, the diameter of the tip of the convex portion may be smaller than the diameter of portions other than the tip. As a result, the convex portion is easily inserted into the positioning hole.

The bonding of a flat cable and a mounting board is not limited to solder bonding and may be any bonding, such as an anisotropic conductive film and an adhesive tape, for example, as long as the flat cable and the mounting board are bonded, adhered, or stuck to each other, in a planar manner.

In addition, the configurations of each of the above-described preferred embodiments may be properly combined, and the advantageous operational effects produced by the configuration of each of the above-described preferred embodiments is able to be obtained in such combined configurations.

Moreover, in the configuration of each of the above-described preferred embodiments, in a plan view, the conductor surrounding a positioning hole is continuous over the entire or substantially the entire periphery, but may be partially cut off, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite substrate comprising: a flexible board including a flexible insulating base material; and a mounting board bonded to the flexible board; wherein the flexible board includes: a first end in a length direction; a second end in the length direction; a first bonding portion provided in a vicinity of the first end; a second bonding portion provided in a vicinity of the second end; a circuit portion provided between the first bonding portion and the second bonding portion in the length direction; a first positioning member of which at least a portion is provided between the first end and the first bonding portion in the length direction; and a second positioning member of which at least a portion is provided between the second end and the second bonding portion in the length direction; the mounting board includes: a first mounting board side bonding portion to which the first bonding portion is to be bonded by surface mounting; a second mounting board side bonding portion to which the second bonding portion is to be bonded by surface mounting; a first mounting board side positioning member to be fixed to the first positioning member; and a second mounting board side positioning member to be fixed to the second positioning member; wherein the first positioning member includes a positioning hole provided in the flexible board; and the first mounting board side positioning member includes a convex portion provided on the mounting board; wherein the flexible board further comprises an auxiliary conductor located in proximity to the positioning hole and surrounding or substantially surrounding the positioning hole in a plan view; and the positioning hole has a shape in which a plane cross sectional area decreases from a surface of the flexible board on a side on which the flexible board is mounted to the mounting board toward a center position in a thickness direction of the flexible insulating base material.

2. The composite substrate according to claim 1, wherein the second positioning member includes a positioning hole provided in the flexible board; and the second mounting board side positioning member includes a convex portion provided on the mounting board.

3. The composite substrate according to claim 1, wherein the second positioning member includes a convex portion provided on the flexible board; and the second mounting board side positioning member includes a positioning hole provided in the mounting board.

4. The composite substrate according to claim 1, wherein the flexible insulating base material is made of a thermoplastic resin.

5. The composite substrate according to claim 1, wherein the flexible board further comprises a curved portion or a corner portion at an intermediate position in the length direction.

6. The composite substrate according to claim 1, wherein the circuit portion comprises a passive element including a conductor pattern.

7. The composite substrate according to claim 6, wherein the passive element is a coil.

* * * * *